United States Patent
Motoyanagi et al.

(10) Patent No.: US 9,803,829 B2
(45) Date of Patent: Oct. 31, 2017

(54) LIGHT DISTRIBUTION LENS

(71) Applicants: ASAHI RUBBER INC, Saitama (JP); NICHIA CORPORATION, Tokushima (JP)

(72) Inventors: Takayuki Motoyanagi, Saitama (JP); Munetomo Nakamura, Saitama (JP); Masutsugu Tasaki, Saitama (JP); Hiroki Oguro, Tokushima (JP)

(73) Assignees: ASAHI RUBBER, INC., Saitama (JP); NICHIA CORPORATION, Tokushima (JP)

( * ) Notice: Subject to any disclaimer, the term of this patent is extended or adjusted under 35 U.S.C. 154(b) by 293 days.

(21) Appl. No.: 14/672,061

(22) Filed: Mar. 27, 2015

(65) Prior Publication Data
US 2015/0276170 A1    Oct. 1, 2015

(30) Foreign Application Priority Data
Mar. 28, 2014 (JP) ................................. 2014-069186

(51) Int. Cl.
*F21V 5/04* (2006.01)
*G02B 19/00* (2006.01)
(Continued)

(52) U.S. Cl.
CPC ............ *F21V 5/04* (2013.01); *G02B 19/0014* (2013.01); *G02B 19/0061* (2013.01);
(Continued)

(58) Field of Classification Search
CPC ....... F21V 5/04; F21V 5/048; G02B 19/0009; G02B 19/0061; G02B 19/0014; H01L 33/58
(Continued)

(56) References Cited

U.S. PATENT DOCUMENTS 8,382,338 B2 *   2/2013   Lee ........................... F21V 5/04
                                                                  362/311.06
9,057,805 B2 *   6/2015   Hu ........................... G02B 3/00

FOREIGN PATENT DOCUMENTS

JP        2010/524170 A    10/2008
JP          5148682 B        4/2011
(Continued)

*Primary Examiner* — Seung Lee
(74) *Attorney, Agent, or Firm* — Brian S. Boyer; Syndicated Law, PC

(57) ABSTRACT

A lens for light emitting lamps that use light emitting elements such as LEDs, etc., is provided. The lens has a specific surface shape for light-distribution control to achieve desired light distributions, as well as a light emitting device using said lens. On the lens surface of the light emitting side which has a double-peak shape to obtain a light distribution characteristic having long and short two axes, by possessing a straight-line part in the surface shape of the light emitting side viewed on the lens short-axis cross section, a desired smoothly-diffused light distribution having a longitudinal direction with a certain width is obtained. The lens may be designed to have a surface of the light emitting side comprising a collection of straight lines parallel to the lens short-axis cross section, or to have a continuous curved surface comprising a collection of straight lines parallel to the lens short axis.

22 Claims, 16 Drawing Sheets

(51) Int. Cl.
    *H01L 33/58* (2010.01)
    *F21Y 115/10* (2016.01)
(52) U.S. Cl.
    CPC ........... *F21Y 2115/10* (2016.08); *H01L 33/58* (2013.01); *Y10T 29/49144* (2015.01)
(58) Field of Classification Search
    USPC ........................................................ 362/335
    See application file for complete search history.

(56) References Cited

FOREIGN PATENT DOCUMENTS

| | | |
|---|---|---|
| JP | 2013/516785 A | 1/2012 |
| JP | 2013/138207 A | 6/2013 |
| JP | 1445641 | 1/2014 |
| JP | 1445897 | 1/2014 |
| JP | 2014/022489 A | 2/2014 |
| JP | 2014/216763 A | 12/2014 |
| WO | WO2009/157166 | 10/2010 |
| WO | WO2012/147342 | 1/2014 |

* cited by examiner

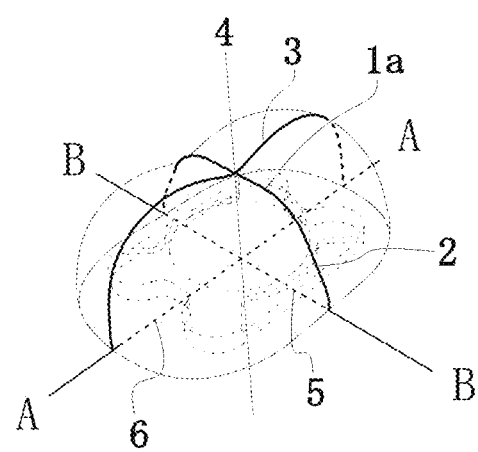
FIG. 1A
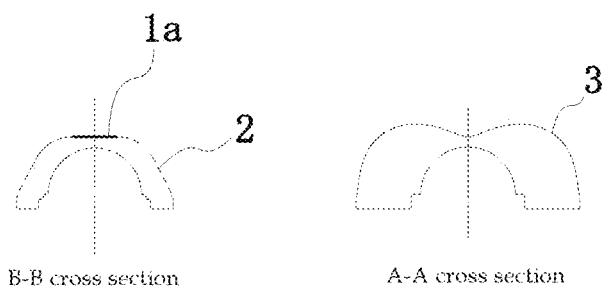
B-B cross section
FIG. 1B(1)
A-A cross section
FIG. 1B(2)

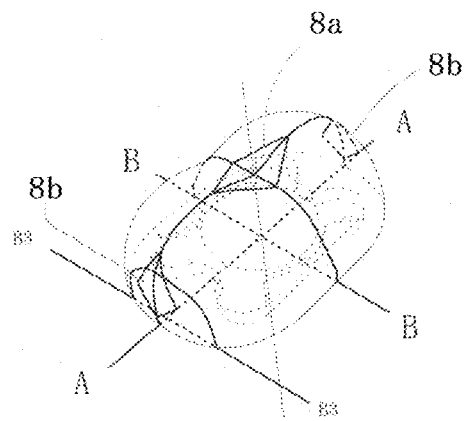
FIG. 5A(1)
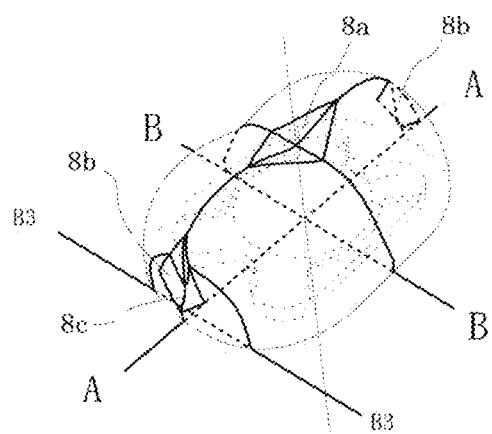
FIG. 5A(2)
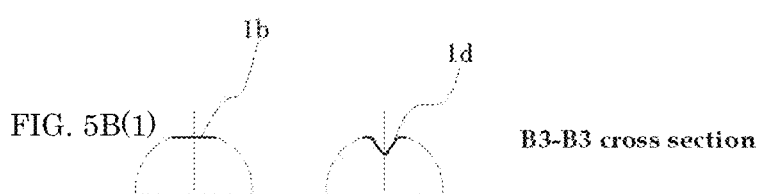
FIG. 5B(1)   FIG. 5B(2)   B3-B3 cross section
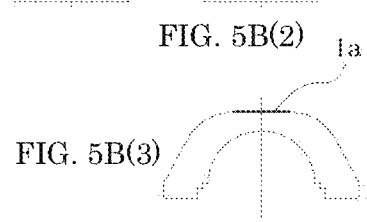
FIG. 5B(3)   B-B cross section

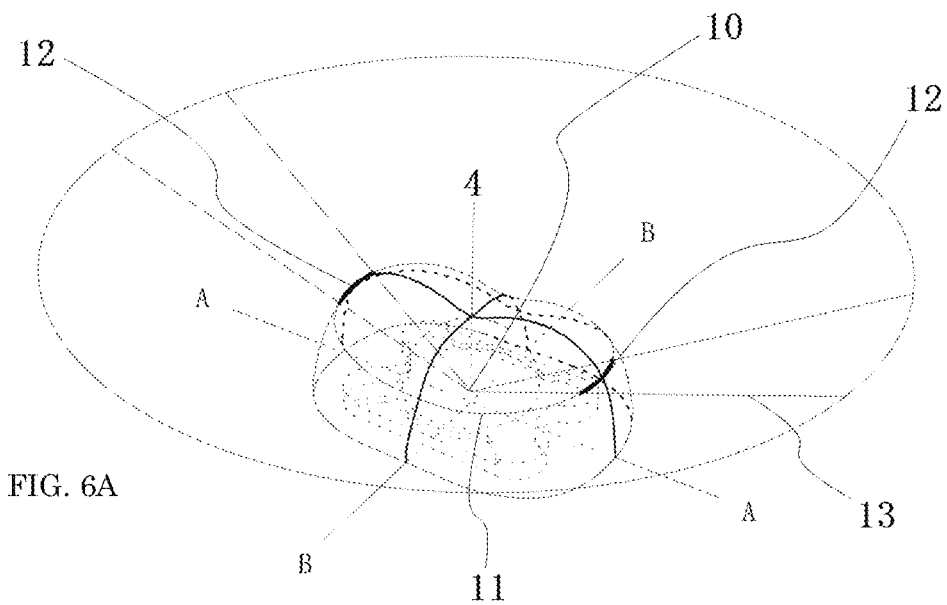
FIG. 6A
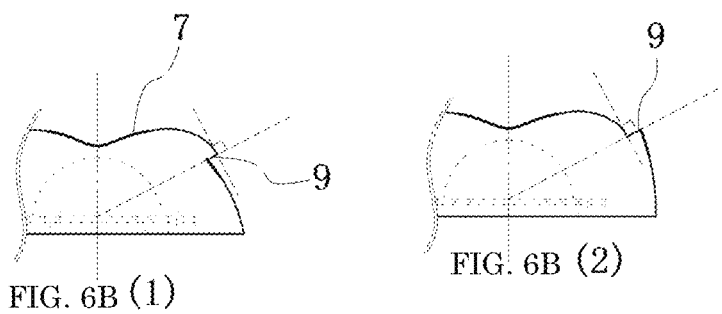
FIG. 6B (1)    FIG. 6B (2)
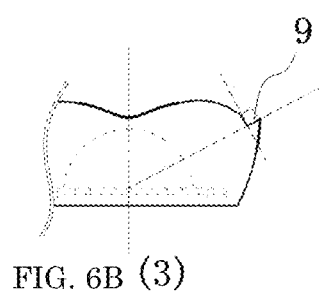
FIG. 6B (3)

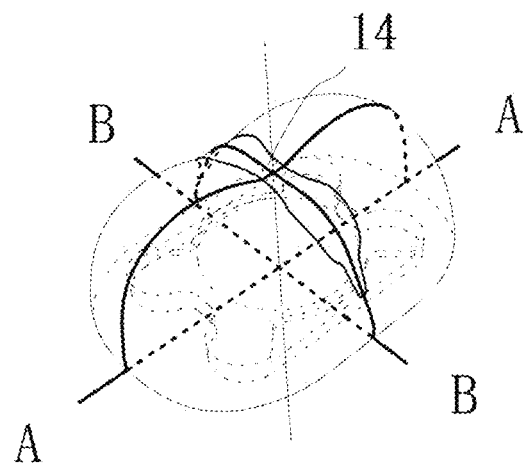
FIG. 7A
B-B cross section
FIG. 7B(1)
A-A cross section
FIG. 7B(2)

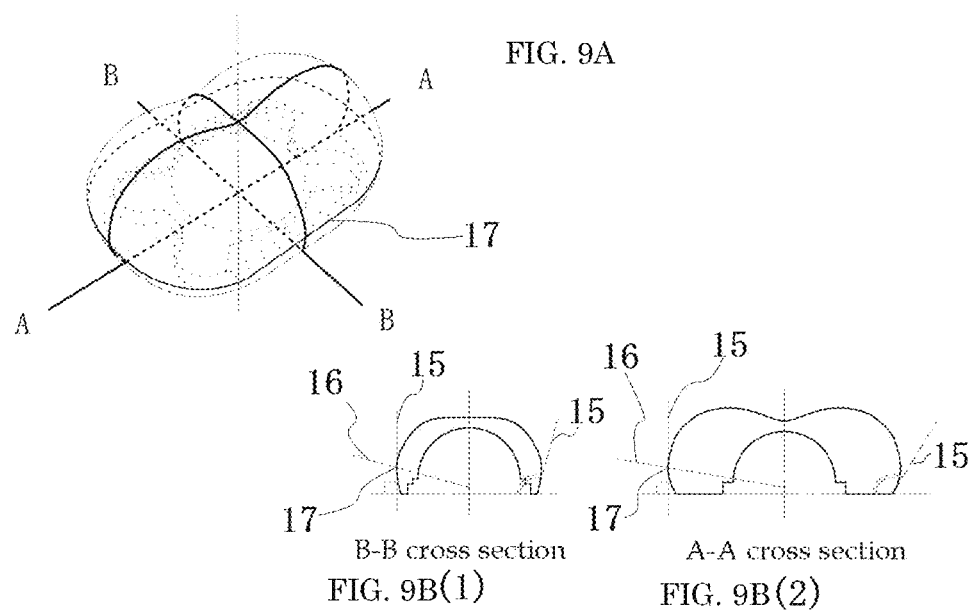

FIG. 10A
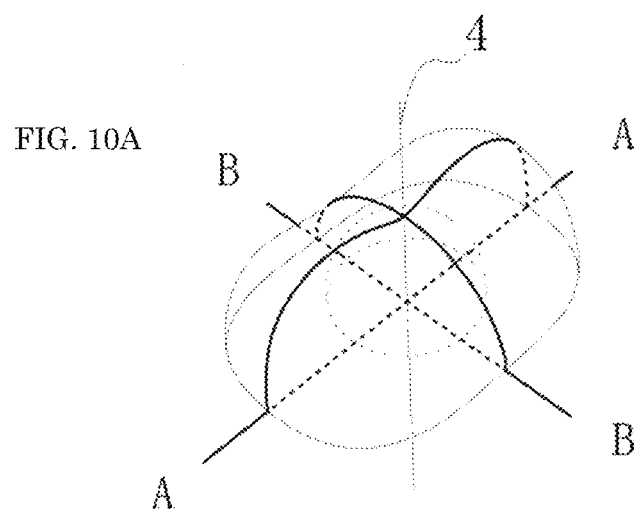
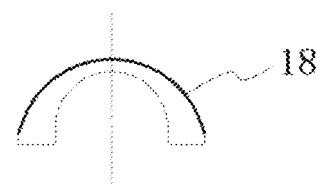
B-B
FIG. 10B(1)
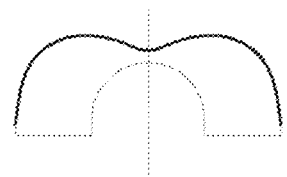
A-A
FIG. 10B(2)

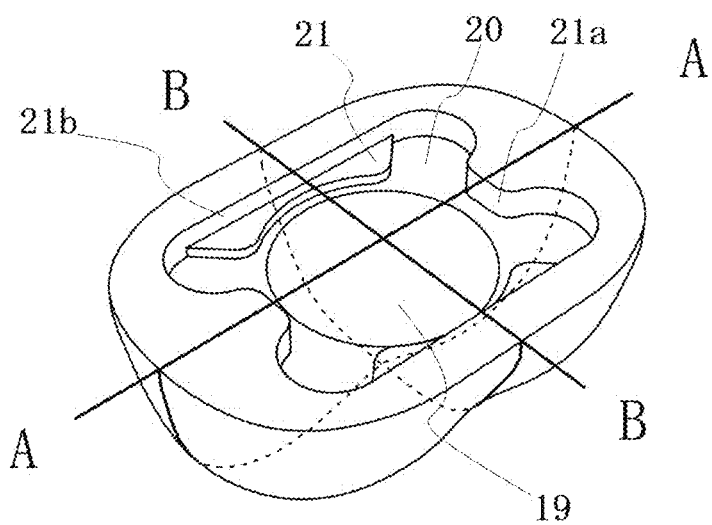
FIG. 12A
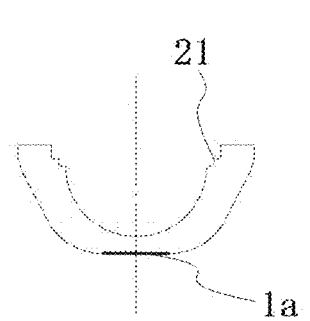
B-B cross section
FIG. 12B(1)
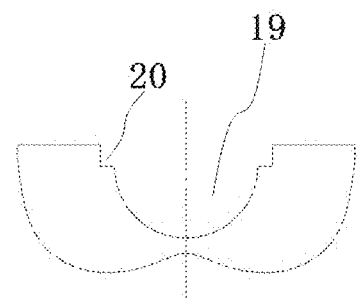
A-A cross section
FIG. 12B(2)

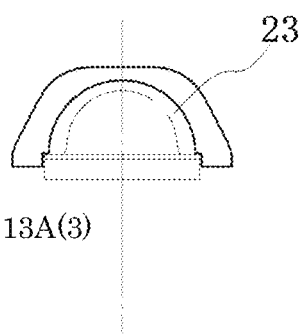
FIG. 13A(3)
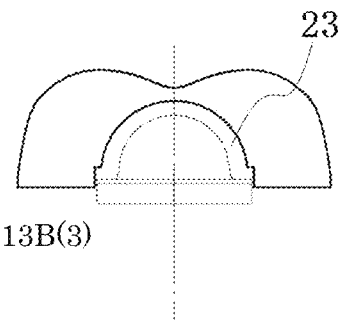
FIG. 13B(3)
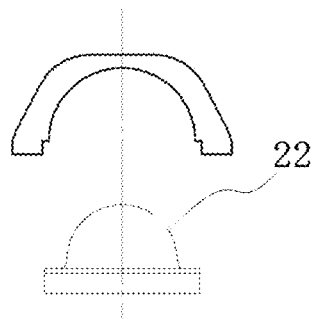
FIG. 13A(2)
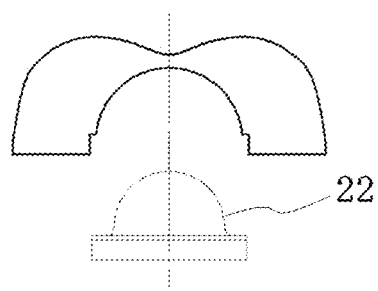
FIG. 13B(2)
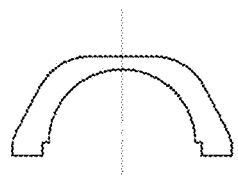
FIG. 13A(1)
B-B cross section
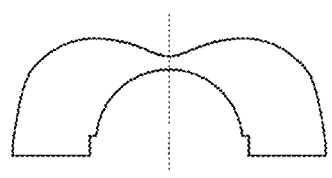
FIG. 13B(1)
A-A cross section

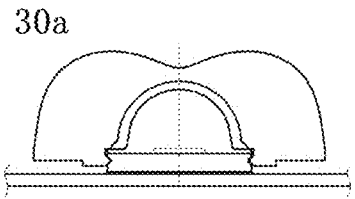
FIG. 15A(3)
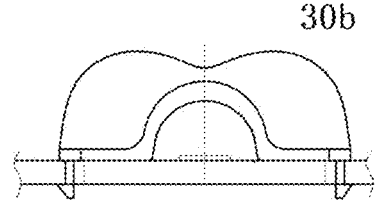
FIG. 15B(3)
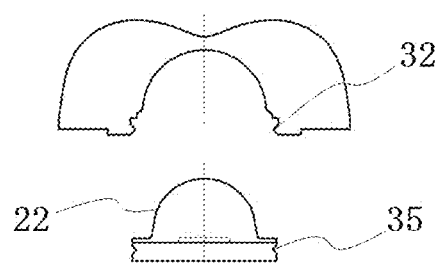
FIG. 15A(2)
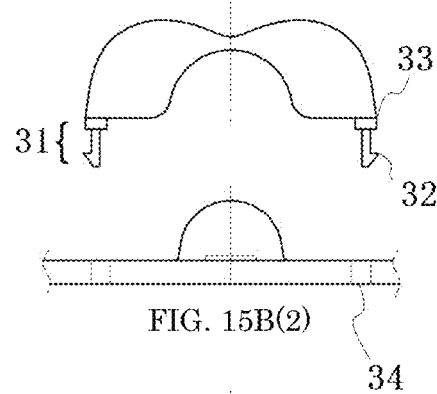
FIG. 15B(2)
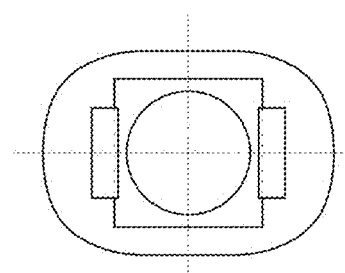
FIG. 15A(1)
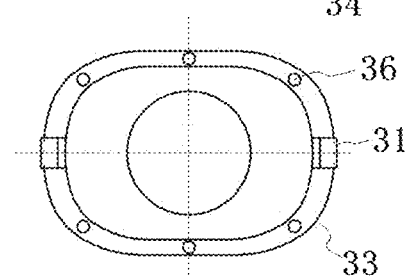
FIG. 15B(1)

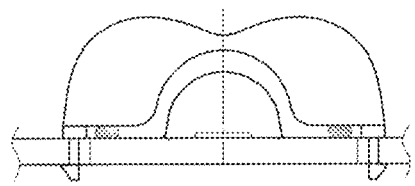
FIG. 16A
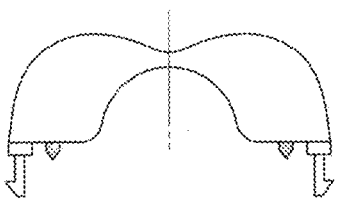
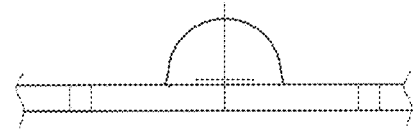
FIG. 16B
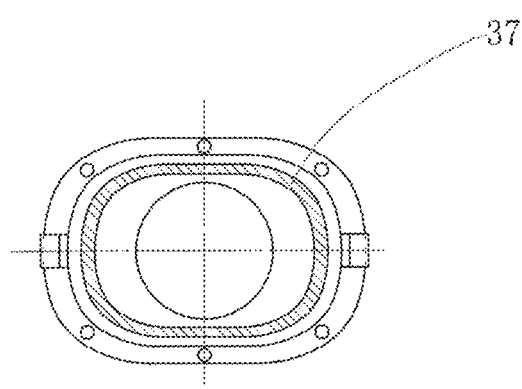
FIG. 16C

LIGHT DISTRIBUTION LENS

CROSS-REFERENCE TO RELATED APPLICATIONS

This application claims the benefit of Japanese Patent Application No. 2014-069186, filed Mar. 28, 2014, which is hereby incorporated by reference in its entirety.

BACKGROUND

Field of the Invention

The present invention relates to a lens to be provided on a light emitting element lamp, etc. that uses a light emitting element such as an LED.

Description of the Related Art

More specifically, the present invention relates to a lens having a specific surface shape for light-distribution control to achieve desired light distribution when the lens is used, the desired light distribution means an elongated and smoothly-diffused light distribution having long and short axes, of the light from a light emitting element which, without said lens, illuminates a surface to be illuminated in a substantially isotropic and rotationally-symmetric manner, and to a light emitting device using such lens as well as a method of manufacturing thereof.

A lamp, in which a light emitting element, typically an LED, mounted on a base board is combined with a lens that enables desired light distribution state of the light from the light-emitting element, has been known. Lenses used in these lamps, for example when used as a backlight of display devices or the like, are required to have desired light distribution characteristics of a backlight, and when used as a street light, they are required to have light distribution characteristics of the street light suitable for road surface.

In the prior art, as a lens for light emitting elements which provides light distribution characteristic having long and short two axes, for example, the lenses disclosed in Patent Documents 1 and 2 have been known.

The lens of Patent Document 1 is a lens that "provides a light emitting diode which can improve the luminance distribution of conventional light-emitting diodes in which brightness rapidly decreases as the opening angle from the optical axis increases" (paragraph No. 0010), and that "achieves the above objectives by applying a modification to the surface shape of sealing members" (paragraph No. 0011), and that is characterized by the following: "in the light emitting diode comprising a chip placed on a predetermined optical axis and a transparent sealing member for sealing the chip from the front side of said optical axis, a curved surface portion is formed on the front surface of the sealing member, and a cross-sectional shape of this curved surface portion along a first plane including the optical axis, is composed of a waveform curved surface having a concave curve near the optical axis and convex curves at both lateral sides of the concave curve, and, a cross-sectional shape of this curved surface portion along a second plane that is parallel to the optical axis and is perpendicular to the first plane is composed of a convex curve" (paragraph No. 0012).

The lens of Patent Document 2 is "an optical device for providing desired shape to the light beam" (paragraph No. 0001), which "relates to an illuminated surface, in particular, an illuminated surface having a longer length relative to its width, such as road, street or highway" (paragraph No. 0001), and is "an optical device for providing an elongated shape for the light beam" (paragraph No. 0010), wherein "a diopter is an optical surface that separates the two light propagation media having different refractive indices" (paragraph No. 0018), and the optical device "has two mutually-perpendicular symmetry planes IIA and IIB that are also perpendicular to a base plane to which the base plane 5 is inscribed, as shown in FIGS. 2A and 2B. The planes IIA and IIB intersect at the center line 22 of the lens 2" (paragraph No. 0031), and, "in order to provide an elongated shape for the light beam, it is necessary to expand the light beam. Therefore, the exit diopter 4 has a first converging portion 41, a second converging portion 42, and a diverging portion 43 that bridges the first and second convergent portions 41 and 42" (paragraph No. 0032). And the lens has a surface shape wherein "when the curve included between positions C and D is rotated about the axis 23, the entire exit diopter 4 is obtained" (paragraph No. 0034).

In these conventional light-distribution adjustment lenses, an elongated light distribution pattern is obtained as follows: in order to make an oval-like pattern having a longitudinal direction instead of circular pattern, the lens does not have a simple spherical surface, but have the cross sectional shape, cut along the longitudinal direction of the illuminance pattern, in which two peaks are present with recessed center between them, so that the light passing through the center of the cross section is diffused on both sides, and the lights are converged into the two directions inclined from the lens center line. Such bimodal shaped lens is referred to as "bat wing lens" from its unique shape of light distribution.

FIGS. 10A, 10B(1), and 10B(2) illustrate an oblique perspective figure of such conventional light distribution adjustment lens, and FIGS. 11A and 11B shows its illuminance pattern and a light distribution characteristic. Since FIG. 11A is a black and white drawing, the illuminance pattern in the left plan view is explained; the inner area of the bright ring represents a portion of high intensity shown in the right intensity scale, and the outer area of the ring in the left plan view represents a portion of low intensity. In all of the illumination intensity distribution diagrams in the present application, illumination intensity is higher in inner area of the bright ring than in outer area. Regarding the light distribution in the longitudinal direction, the light is distributed more in directions inclined from the direction of the lens central optical axis 4 passing through the lens center than in the direction of the axis, so that the light illumination range is elongated; however, its illuminance pattern is, as shown in FIG. 11A, a pattern of the light distribution of a thin oval shape with pointed tips. It was not possible to obtain an illuminated surface with a light distribution wherein a larger area is illuminated while ensuring a constant width in a smoothly-diffused light distribution in the short-axis direction, and a smoothly-diffused light distribution is also obtained in the long-axis direction in an oval-shaped distribution with not-pointed tips, but having certain area. In addition, it was also impossible to obtain a complex light distribution as required, while maintaining an oval shaped smoothly-diffused light distribution, or while maintaining a certain area of light distribution.

That is, in these conventional lenses for light emitting elements, while the light distribution becomes an elongated oval shape due to the long axis cross-sectional shape of the lens of the light emitting side in the longitudinal direction, the lens shape of the light emitting side of the short-axis cross section perpendicular to the longitudinal direction is composed of convex curves (paragraph No. 0012 in Patent Document 1) or is circular or a cross-sectional shape of quadratic curved surface (paragraph Nos. 0033, 0034 in Patent Document 2), and therefore, in the light distribution near the short-axis direction, enhanced effects of rotationally symmetrical and isotropic lens shape for the light source of the light emitting element are reflected on an illuminated surface; as a result, the light distribution in the short-axis direction including the light axis is intensified, and the light does not extend from around the short axis to the longitudinal direction, so that sufficiently homogeneous illuminated-surface is not obtained. In addition, in the illuminance pattern, since the light distribution at the short axis including the optical axis is strong, the overall elliptical shape tends to be an ellipse close to a diamond shape.

PRIOR ART DOCUMENTS

Patent Documents

[Patent Document 1] JP B 5148682
[Patent Document 2] JP A 2010-524170

SUMMARY OF THE INVENTION

The present invention provides a lens to be equipped in a light emitting element such as an LED, etc., which enables distribution of the light from the light emitting element as a light source to be in an elliptical shape close to rectangle or an oval shape with desired illuminance distribution without unevenness, which achieves highly accurate adjustment of light distribution, and which has an oval-shaped light distribution ensuring wider area of smoothly-diffused light distribution compared to conventional oval-shaped light distribution, and which enables to design more precise illuminance pattern.

Furthermore, the present invention provides a lens having a smoothly-diffused light distribution while also having a illuminance pattern having the outline of the illuminated surface has a couple of straight parts extending parallel to the long axis, like a running track, as compared to conventional substantially oval-shaped light distribution that tends to have an intensified light distribution along the short axis position of the oval; in addition, the present invention provides a lens and a light emitting device which provide an illuminance pattern close to rectangle.

Means for Solving the Problems

The present invention relates to the following light distribution lens (hereinafter, the lens according to the present invention is also referred to as simply "the lens") and a light emitting device, which solve the above problems.

The present invention has the following aspects:

[1] A light distribution lens to be placed on a light emitting element, having a light incident side facing the light emitting element and a light emitting side opposite to the light incident side, wherein a planar shape formed by the outline of the lens viewed from the light emitting side has a long axis on the light incident side of the lens and a short axis perpendicular to the long axis on the same plane, and wherein the lens central optical axis passing through the light source center of the light emitting element from the light incident side to the light emitting side is perpendicular to each of said long axis and short axis at their intersection, and wherein the lens surface of the light emitting side has the following three-dimensional surface shape:

i.e., in the lens long-axis cross section which is a lens's cross section taken along the plane including the long axis and the lens central optical axis, said shape is concave at and near the lens central optical axis, and is convex at both of its lateral sides, and in the lens short-axis cross section which is a lens's cross section taken along the plane including the short axis and the lens central optical axis, said shape has a straight-line part at and near the lens central optical axis and the length of the straight-line part is 5% or more relative to the length of the short axis, and is convex at both of its lateral sides.

[2] The light distribution lens according to [1], in which the lens surface of the light emitting side has a three-dimensional surface shape, wherein, in a lens cross section taken along a plane parallel to the lens short-axis cross section and passing continuous positions along the curve of the light emitting side of the lens long-axis cross section, the surface shape has a straight-line part that is parallel to the lens short-axis cross section and that intersects with the lens long-axis cross section, and has convex parts at both of its lateral sides wherein a continuous curved surface, that intersects with the central optical axis, is formed from a set of such straight-line parts along the curve of the light emitting side of the lens long-axis cross section.

[3] The light distribution lens according to [2], wherein the straight-line part that is parallel to the lens short-axis cross section, is parallel to the lens short axis.

[4] The light distribution lens according to [2] or [3], wherein the shape of the lens surface of the light emitting side in a lens cross section taken along a plane parallel to the lens short-axis cross section and at the position included in said continuous curved surface has a straight-line part that is parallel to the lens short axis and that intersects with the lens long-axis cross section, wherein the length of said continuous curved surface in the long-axis direction viewed from the light emitting side is 8% or more of the length of the long axis.

[5] The light distribution lens according to [4], wherein, as the continuous curved surface formed along the curve of the light emitting side of the lens long-axis cross section, in addition to the first continuous curved surface through which the lens central optical axis passes, there is (a) second continuous curved surface(s) in which the lens central optical axis position is not included, and which is(are) formed at the convex part of the lens long-axis cross section distant from the first continuous curved surface.

[6] The light distribution lens according to [5], wherein, in the convex part of the light emitting side of the lens long-axis cross section, the lens has a notch at points on the convex curve at which a line connecting the light source center and the points on the convex curve coincides with the normal lines of the convex curve at the points, and wherein said notch is provided along the normal lines from the convex curve such that either a convex curve portion outside of the normal lines becomes concave, or a convex curve portion outside of the normal lines becomes convex, thereby providing a second continuous curved surface at the convex part that is in contact with the notch and outside of the normal lines.

[7] The light distribution lens according to any one of [1] to [6], wherein in the lens long-axis cross section, the shape of the light emitting side has a straight-line part with a length of less than 5% of the length of the long axis at and near the lens central optical axis position, and the shape is concave at both of its lateral sides and is convex at further lateral sides.

[8] The light distribution lens according to [7], wherein the straight-line part of the long-axis cross section and the short-axis cross section further has a concave.

[9] The light distribution lens according to any one of [1] to [5] and [7] and [8], wherein the three-dimensional shape of the lens surface of the light emitting side is a smooth continuous curved surface.

[10] The light distribution lens according to [6], wherein the three-dimensional shape of the lens surface of the light emitting side excluding the notch is a smooth continuous curved surface.

[11] The light distribution lens according to any one of [1] to [10], wherein the convex shape is composed of curves with different curvatures.

[12] The light distribution lens according to any one of [1] to [11], wherein the convex shape at positions lateral to the straight-line part in the shape of the light emitting side of the long-axis cross section has a circular arc composed of a simple circle.

[13] The light distribution lens according to any one of [1] to [12], wherein the lens has a surface including a straight line almost parallel to the lens central optical axis throughout or a part of the periphery of the lens, and said surface constitutes the whole or a part of the outline of the lens.

[14] The light distribution lens according to any one of [1] to [13], wherein the three-dimensional shape of the lens surface of the light emitting side has a convex shape rising upward and expanding outward from the outline shape of the lens base plane of the light incident side, wherein the outline shape of the lens viewed from the light emitting side is larger than the outline shape of the lens base plane of the light incident side.

[15] The light distribution lens according to any one of [1] to [14], wherein the three-dimensional shape of the lens surface of the light emitting side has two mirror symmetry planes perpendicular to each other, and wherein the lens central optical axis is the line of intersection of these mirror symmetry planes.

[16] The light distribution lens according to any one of [1] to [15], wherein the lens has, at its light incident side, an escape recess to house the whole or a part of a light emitting element, a sealing member for the light emitting element, and/or a circuit board on which these are placed.

[17] The light distribution lens according to any one of [1] to [15], wherein the lens has, at its light incident side, a liquid escape recess for an adhesive or filler.

[18] The light distribution lens according to [17], wherein the outline of the liquid escape recess is, when viewed from the light incident side, a polygonal shape, a star shape with radially-arranged convex portions, or a shape with rounded angles thereof.

[19] A light emitting device, comprising a board or a circuit board on which a light distribution lens according to any one of [1] to [18] and a light emitting element are placed.

[20] The light emitting device according to [19], wherein a gap is provided between the lens surface of the light incident side and the circuit board on which a light emitting element is placed.

[21] A method of manufacturing a light distribution lens, characterized in that the lens are according to any one of [1] to [18] and is formed by injecting any of cycloolefin, cycloolefin copolymer, acrylic, silicone, epoxy, and a resin or rubber thereof into a mold and curing it.

[22] A method of manufacturing a light emitting device that comprises a board on which a light distribution lens according to any one of [1] to [18] and a light emitting element are placed, wherein the method comprises any of the following steps (1) to (3):

(1) a step of preparing an LED package in which a semiconductor light-emitting element (chip) electrically connected to the terminals of electrodes is sealed with a transparent material; a step of preparing the light distribution lens having an escape recess and a liquid escape recess on the lens surface of the light incident side, a step of filling the escape recess with an adhesive, a step of bonding the adhesive-filled part to the sealing part of the LED package by pressing them each other such that the emission center matches the central optical axis of the lens; a step of curing the adhesive, and a step of placing and fixing the LED package on a circuit board;

(2) a step of placing a semiconductor light-emitting element (chip) as the light emitting element on the circuit of the board which is a circuit board, electrically connecting the light-emitting element (chip) to the circuit to produce the circuit board having a chip-on-board LED light-emitting source; a step of preparing a light distribution lens having an escape recess and a liquid escape recess on the lens surface of the light incident side, a step of filling the escape recess with an adhesive, a step of bonding the adhesive-filled part to the LED light-emitting source by pressing them each other such that the emission center of the semiconductor light-emitting element matches the central optical axis of the lens, and a step of curing the adhesive; and, (3) a step of preparing the lens having a fitting mechanism, a step of preparing the board which is a circuit board having a chip-on-board LED light-emitting source, in which an LED package or a semiconductor light-emitting element (chip) equipped with a fitting-receiving mechanism that fits with the fitting mechanism provided on the lens, is placed on the circuit board, and a step of integrating the lens with the LED package or the circuit board via the fitting mechanism, without using an adhesive.

Advantageous Effects of the Invention

In the present invention, since the lens has a double-peak shape in the long axis cross-sectional outline of the light emitting side, the light distribution spreads in the long-axis direction of the lens, and a wider light distribution is obtained in the long-axis direction in term of the distribution of luminous intensity.

In the short-axis cross-sectional outline of the light emitting side of the lens, owing to the existence of a straight-line part at and near the lens central optical axis, the light distribution at and around the short axis spreads out to the lateral sides in the long-axis and short-axis directions distant from the short axis, so that smoothly-diffused light distribution is obtained.

In addition, desired light distribution can be obtained by modifying the straight-line part provided near the lens central optical axis in cross sections parallel to the short-axis cross section.

In another embodiment of the present invention, in the vicinity of the lens central optical axis position, the lens has a straight-line part parallel to the short axis, which is also perpendicular to the lens long-axis cross section, in the outline of the light emitting side of not only the lens short-axis cross section but also lens cross sections that are taken along the planes parallel to the lens short-axis cross section. In particular, in the vicinity of the lens central optical axis position including said axis, the lens has a straight-line part parallel to the short axis, which is also perpendicular to the lens long-axis cross section, in the outline of the light emitting side of a lens cross section taken along a plane parallel to the lens short-axis cross section;

therefore, the straight-line parts parallel to the short axis are continuously provided, so that the continuous curved surface is formed from a plurality of straight-line parts in the long-axis direction along the outline of the light emitting side of the long-axis cross section, and accordingly, the light distribution near the short axis spreads to the long-axis direction, thereby making the concentrated part of the light distribution around the short axis more smoothly-diffused, and also extending the light distribution around the short axis in a manner parallel to the long axis; consequently, the light distribution pattern resembles a 400-m running track having straight-line parts parallel to the long axis, and a significantly smoothly-diffused excellent light distribution pattern having a certain width and length can be obtained.

Furthermore, the lens may have, as a continuous curved surface formed along the curve of the light emitting side of the lens long-axis cross section, a first continuous curved surface intersecting with the lens central optical axis as well as a second continuous curved surface not intersecting with the lens central optical axis, and this second continuous curved surface is formed at a convex part of the lens long-axis cross section distant from the first continuous curved surface; due to this, the curvature of the oval illuminance pattern near the tip of its long axis on the illuminated surface can be reduced to make the light distribution pattern close to a rectangle.

Furthermore, in another aspect of the present invention, a straight-line part may also be provided in the long-axis direction of the lens long-axis cross section, so that a light distribution with relatively high illuminance can be added to the central part of the illuminated surface with smoothly-diffused excellent light distribution having a certain width and length.

BRIEF DESCRIPTION OF DRAWINGS

FIGS. 1A, 1B(1), and 1B(2) are diagrams showing one example of the lens according to some embodiments. FIG. 1A shows an oblique perspective figure of the lens, FIG. 1B(1) shows the lens short-axis cross section (B-B cross section), and FIG. 1B(2) shows the lens long-axis cross section (A-A cross section).

FIG. 2A shows an illuminance pattern of the illuminated surface, FIG. 2B shows a light distribution characteristic diagram.

FIGS. 3A, 3B, 3C(1), 3C(2), 3C(3), and 3C(4) are diagrams showing another example of the lens, according to some embodiments. FIG. 3A shows an oblique perspective figure of the lens, FIG. 3B shows its plan view, FIG. 3C(4) shows the lens long-axis cross section (A-A cross section), FIG. 3C(3) shows the lens short-axis cross section (B-B cross section), and FIGS. 3C(2) and (1) shows the cross sections parallel to the lens short-axis cross section (B1-B1 and B2-B2 cross sections).

FIG. 4A shows an illuminance pattern of the illuminated surface, FIG. 4B shows a light distribution characteristic diagram.

FIGS. 5A(1), 5B(2), 5B(1), 5B(2), and 5B(3) are diagrams showing another example of the lens according to some embodiments. FIGS. 5A(1) and 5A(2) show an oblique perspective figure of the lens, FIG. 5B(1) shows a cross section (B3-B3 cross section) parallel to the lens short-axis cross section (B-B cross section) in FIG. 5A(1), FIG. 5B(2) shows one example of a cross section (B3-B3 cross section) parallel to the lens short-axis cross section (B-B cross section) in FIG. 5B(2), and FIG. 5B(3) shows the lens short-axis cross section (B-B cross section).

FIGS. 6A, 6B(1), 6B(2), and 6B(3) are diagrams showing another example of the lens according to some embodiments. FIG. 6A is an oblique perspective figure of the lens illustrating a notch appearing on the convex part, and FIGS. 6B(1)-(3) show a partial diagram of the cross section along the long axis of the lens with a notch.

FIGS. 7A, 7B(1), and 7B(2) are diagrams showing another example of the lens according to some embodiments. FIG. 7A shows an oblique perspective figure of the lens, FIG. 7B(1) shows the lens short-axis cross section (B-B cross section), and FIG. 7B(2) shows the lens long-axis cross section (A-A cross section).

FIG. 8A shows an illuminance pattern, FIG. 8B shows a light distribution characteristic diagram.

FIGS. 9A, 9B(1), and 9B(2) are diagrams showing another example of the lens according to some embodiments. FIG. 9A shows an oblique perspective figure of the lens, FIG. 9B(1) shows the lens short-axis cross section (B-B cross section), and FIG. 9B(2) shows the lens long-axis cross section (A-A cross section).

FIGS. 10A, 10B(1), and 10B(2) show a conventional bat wing lens, according to some embodiments. FIG. 10A shows an oblique perspective figure of the lens, FIG. 10B(1) shows the lens short-axis cross section (B-B cross section), and FIG. 10B(2) shows the lens long-axis cross section (A-A cross section).

FIG. 11A shows an illuminance pattern of the illuminated surface, and FIG. 11B shows a light distribution characteristic diagram.

FIGS. 12A, 12B(1), and 12B(2) show a lens of one example, according to some embodiments. FIG. 12A shows an oblique perspective figure of the lens viewed from the light incident side, FIG. 12B(1) shows the lens short-axis cross section (B-B cross section), and FIG. 12B(2) shows the lens long-axis cross section (A-A cross section).

FIGS. 13A(1), 13A(2), 13A(3), 13B(1), 13B(2), and 13B(3) show cross sections illustrating the integration of the lens of FIGS. 12A, 12B(1), and 12B(2) with an LED package, according to some embodiments. FIG. 13A shows illustration diagrams in terms of the lens short-axis cross section, and FIG. 13B shows illustration diagrams in terms of the lens long-axis cross section.

FIG. 14A shows an example of a cross section along the long axis of the light emitting device, and FIG. 14B shows another example of a cross section along the long axis of the light emitting device.

FIGS. 15A(1), 15A(2), 15A(3), 15B(1), 15B(2), and 15B(3) show cross sections of another example of light emitting device according to some embodiments. FIG. 15A shows a case wherein fitting is carried out on the base side of an LED package, FIG. 15B shows a case having legs. The uppermost diagrams are cross-sectional views of a fitted state, middle diagrams are cross-sectional views before fitting of the lens, and lowermost diagrams show the lens planes viewed from the light incident side.

FIGS. 16A, 16B, and 16C show cross sections of another example of light emitting device according to some embodiments. The upper diagram is a cross-sectional view of a fitted state, middle diagram is a cross-sectional view before fitting of the lens, and lower diagram is the lens plane viewed from the light incident side.

MODES FOR CARRYING OUT THE INVENTION

Figure 2A:
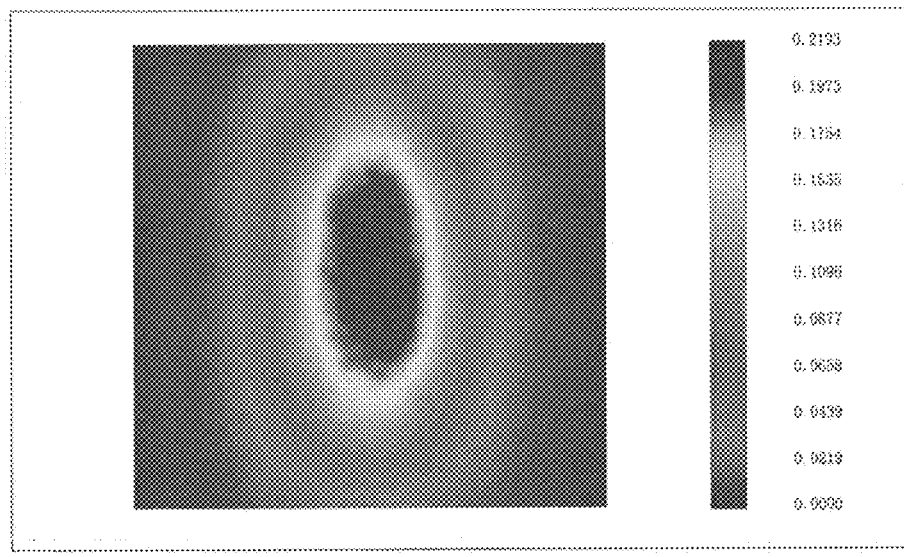
FIGS. 2A and 2B show an illuminance pattern and a light distribution characteristic diagram of a surface illuminated using the light distribution lens of FIGS. 1A, 1B(1), and 1B(2), according to some embodiments.

Hereinafter, the light distribution lens is explained with reference to the drawings.

First Embodiment

The light distribution lens according to the first embodiment of the present invention has a light-incident side facing a light emitting element and a light emitting side opposite to the light incident side, wherein the external shape of the lens viewed from the light emitting side has a long axis and a short axis perpendicular to the long axis, and has a central optical axis of the lens passing through the light source center of the light emitting element from the light incident side to the light emitting side, wherein the lens central optical axis is perpendicular to each of said long axis and short axis at their intersection.

The shape of the lens surface of the light emitting side is a three-dimensional surface shape comprising the lens long-axis cross section that is a lens cross section including said long axis and the lens central optical axis, and the lens short-axis cross section that is a lens cross section including said short axis and the lens central optical axis.

That is, the shape of the lens surface of the light emitting side in the lens long-axis cross section is concave at and near the lens central optical axis, and is convex at both lateral sides of the concave part. The shape of the lens surface of the light emitting side in the lens short-axis cross section has a straight-line part with a length of 5% or more relative to the length of the short axis at and near the lens central optical axis, and is convex at both lateral sides of the straight-line part.

Here, the lengths of the long axis and short axis refer to the lengths of the lens surface of the light incident side which appear in the lens long-axis cross section and the short-axis cross section. In the case where a flange, etc. is provided on the outer periphery of the lens surface of the light incident side, so that the outline of the lens shown on the plane of the light emitting side becomes larger than the outline of the lens of the light incident side, then the lengths of the long axis and short axis refer to the lengths of the long and short axes that are extended to the intersections with the outline of the convex-shaped lens surface drawn over the lens base surface of the light incident side. In addition, as will be described later, the positional relationship between the light source center and the plane including the short and long axes is as follows: when the light source center is positioned inside the lens along the lens central optical axis, the light source center is positioned slightly close to the light emitting side from the plane including the short and long axes; or the light source center may be positioned on the plane including the short and long axes; or the light source center may be positioned outside of the plane including the short and long axes; in any of these cases, the above-mentioned lengths of the long axis and short axis are used.

Viewed from the light emitting side, the short axis is located directly below the straight line passing through the center of the bottom of the concave part formed in the long-axis direction, and the long axis is located directly below the straight line passing through the center of the two peaks in the double-peak shape. The lens central optical axis is located at the intersection of the short axis and the long axis, and is perpendicular to both the short and long axes; therefore, the lens central optical axis is perpendicular to the lens surface of the light incident side. In addition, the light source physically has a light-emitting area, and the center of the light-emitting area is designated to be the light source center.

FIGS. 1A, 1B(1), and 1B(2) are diagrams showing one example of the lens according to some embodiments. FIG. 1A shows an oblique perspective figure of the lens, FIG. 1B(1) shows the lens short-axis cross section (B-B cross section), and FIG. 1B(2) shows the lens long-axis cross section (A-A cross section). The light distribution lens of the first embodiment has a three-dimensional shape as shown in the oblique perspective figure of FIG. 1A. FIG. 1B(1) shows the lens short-axis cross section taken along the plane including the lens central optical axis 4 and the lens short axis (B-B line), and FIG. 1B(2) shows the lens long-axis cross section taken along the plane including the lens central optical axis 4 and the lens long axis (A-A line). In FIG. 1B(1), the shape of the light emission side has a straight-line part 1a that is parallel to the short axis and perpendicular to the lens central optical axis. The length of the straight-line part schematically represented with a thick solid line (hereinafter, it is represented similarly in drawings) is 5% or more relative to the length of the short axis (i.e., the length of the lens on the B-B line). This straight-line part is not present in the conventional light distribution adjustment lenses described above.

Figure 2B:
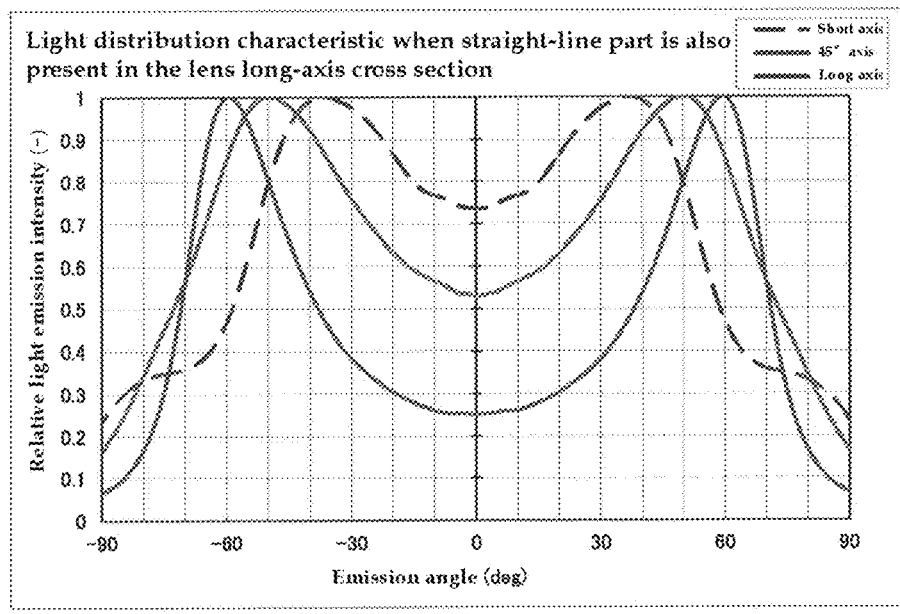

FIGS. 2A and 2B show an illuminance pattern and a light distribution characteristic diagram of a surface illuminated using the light distribution lens of FIGS. 1A, 1B(1), and 1B(2), according to some embodiments. FIG. 2A shows an illuminance pattern of the illuminated surface, FIG. 2B shows a light distribution characteristic diagram. FIG. 2A shows an illuminance pattern of an illuminated surface in the case of a light distribution lens having the straight-line part length of 18% relative to the short axis. The pattern shape has a certain width in the short axis direction, forming an oval or elliptical shape. In this illuminance pattern profile, the edge portion of the relatively outer short axis side is slightly curved, but the profile is almost parallel to the long axis, showing an illuminance pattern close to a straight line extending in the long-axis direction. FIG. 2B shows the light distribution characteristic diagram in this case. In the light distribution characteristic diagram of FIG. 2B, the dotted curve shows the relative light emission intensity appearing along the short axis, the curve showing the smallest value at 0° represents the relative light emission intensity appearing along the long axis, and the other curve shows the relative light emission intensity appearing along the direction with 45° angle relative to the long axis and short axis. Hereinafter, the same definitions are applied in other light distribution characteristic diagrams. As described above, since FIG. 2A is a black and white drawing, the following explanation is applied in the illuminance pattern of the left plan view: the inner area of the bright ring represents a portion of high intensity shown in the right intensity scale, and the outer area of the ring in the left plan view represents a portion of low intensity.

Figure 11A:
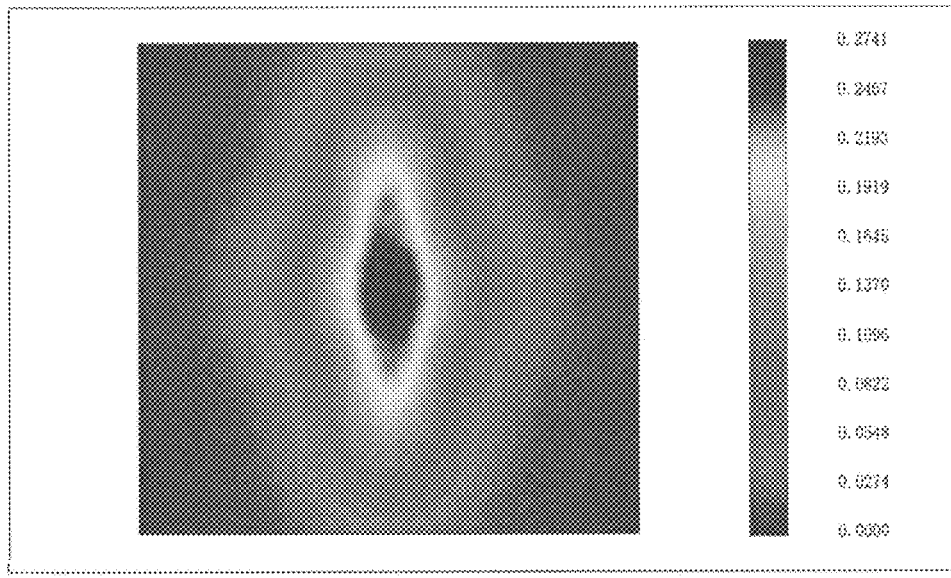
FIGS. 11A and 11B show an illuminance pattern and a light distribution characteristic diagram of a surface illuminated using the lens of FIGS. 10A, 10B(1), and 10B(2), according to some embodiments.
Figure 11B:
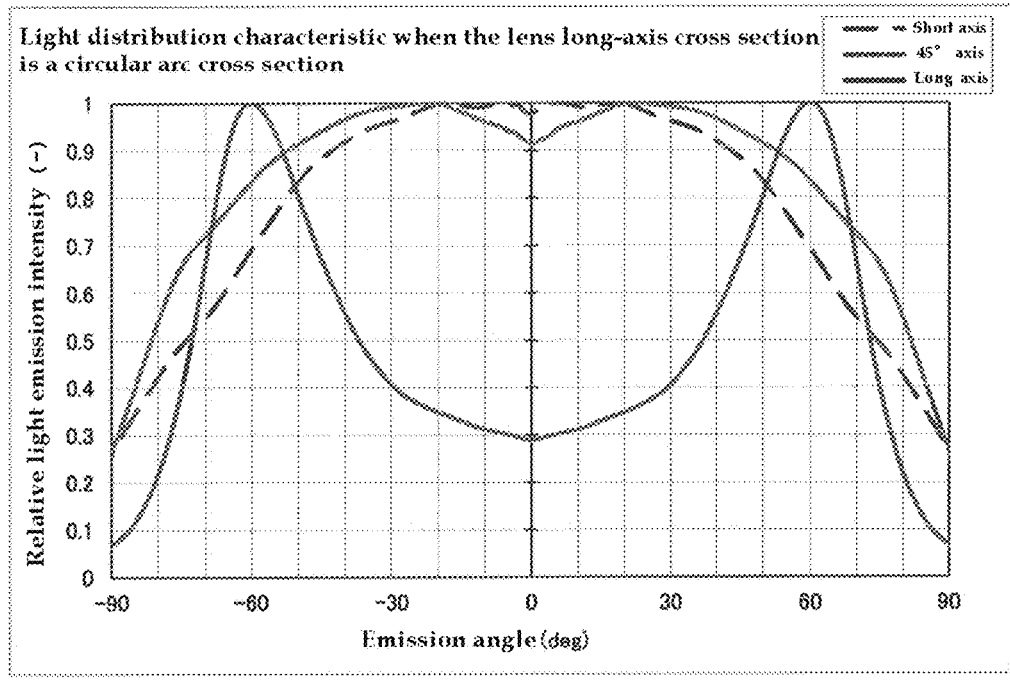

In contrast, FIGS. 10A, 10B(1), and 10B(2) shows a prior art lens, wherein the shape of the lens of the light emitting side in the short-axis cross section shows an arc-like convex curve 18 similar to a simple circle; and FIG. 11A shows the illuminance pattern of a surface illuminated using this lens. Due to the shape of the convex lens with convex short-axis cross section without having a straight-line part in the lens short-axis cross section of the light emitting side, the light is converged near the long axis of the illuminance pattern, and even in the region near the short axis of the illuminance pattern, the light is converged close to the central optical axis and the illuminance pattern shows a strongly-condensed portion near the center of the short axis without showing a wide spread distribution of the light in the width direction. Throughout the long-axis direction, even in an area slightly distant from the long axis of the illuminance pattern, the light does not diffuse to spread around the long axis, and the light distribution with pointed tips in the long axis direction and a small elongated diamond-shaped area is generated, in which the light distribution is not smoothly diffused. Namely, the conventional lens shows a significantly different illuminated surface shape compared to that by the light distribution lens of the first embodiment of the present invention.

Depending on how to design a straight-line part in the lens short-axis cross section, it is possible to obtain a desired degree of spread of light distribution in this illuminance pattern around the short axis and in the short-axis direction. When designing a lens with desired light distribution, this shape is easy to design because it is a straight-line part that should be devised in the lens short-axis cross section. A length of the straight-line part is preferably 5-40% of the length of the short axis. Furthermore, 8-30%, in particular 10-20% is more preferable. When the length of the straight-line part is less than 5% relative to the length of the short axis, the difference in the shape of the lens short-axis cross section between a simple circular shape and the shape with straight line becomes too small, so that an effect of adjustment of light distribution cannot be obtained. When the straight-line part is too long, the light distribution excessively spreads and the illuminance pattern is distorted. In addition, it also affects the convex parts that are connected to the straight-line part of the lens short-axis cross section at the lateral sides. If the length is more than 40%, the range of adjustment by the convex curve having a moderate convex shape in the lateral sides is decreased, leading to a difficulty in obtaining smoothly-diffused light distribution.

The straight-line part may not be in a position symmetrical about the lens central optical axis, and may be inclined with respect to the lens short axis. When it is desired to have an elliptical asymmetric illuminance pattern in the short-axis direction of the illumination pattern, it is possible to set the straight line part as appropriately asymmetric.

The connection of the straight-line part to the convex parts of both lateral sides may be discontinuous (e.g. with edge) or smooth. Smooth connection is preferable because the blight or dark spots caused by refraction changes at discontinuous connections.

Second Embodiment

Figure 3A:
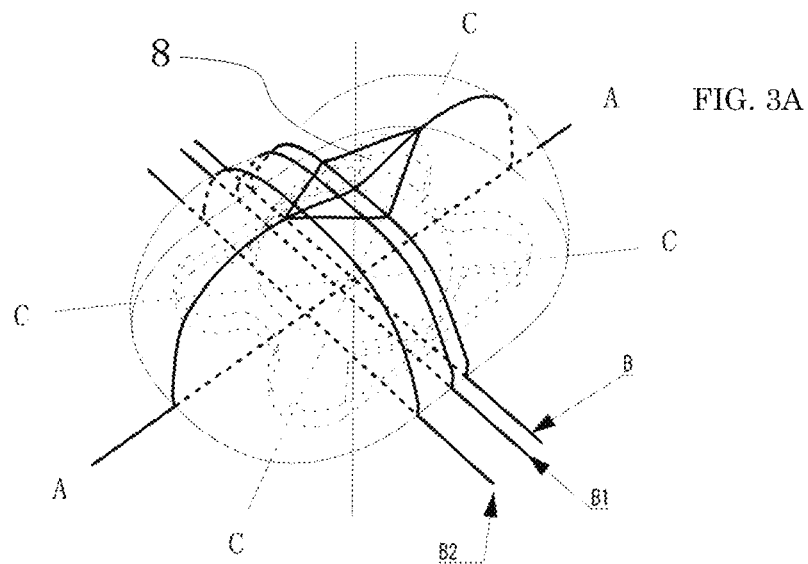
Figure 3B:
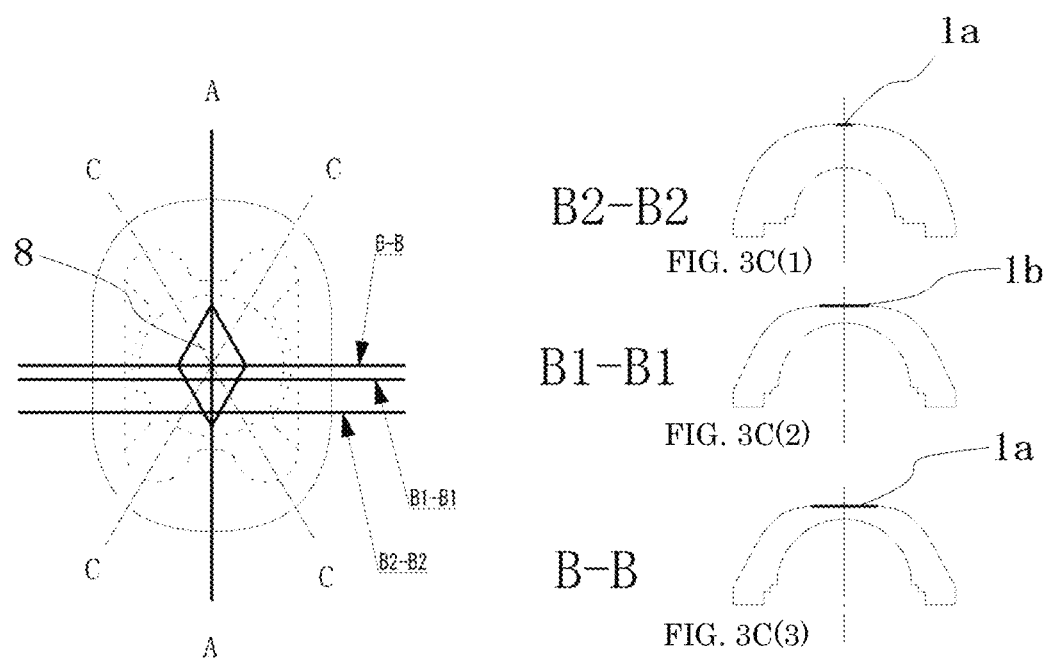

FIGS. 3A, 3B, 3C(1), 3C(2), 3C(3), and 3C(4) are diagrams showing another example of the lens, according to some embodiments. FIG. 3A shows an oblique perspective figure of the lens, FIG. 3B shows its plan view, FIG. 3C(4) shows the lens long-axis cross section (A-A cross section), FIG. 3C(3) shows the lens short-axis cross section (B-B cross section), and FIGS. 3C(2) and (1) shows the cross sections parallel to the lens short-axis cross section (B1-B1 and B2-B2 cross sections).

In the light distribution lens according to the second embodiment of the present invention, as shown in FIGS. 3A, 3B, 3C(1), 3C(2), 3C(3), and 3C(4), the lens surface of the light emitting side has a three-dimensional surface shape, wherein, in a lens cross section taken along a plane parallel to the lens short-axis cross section, the shape has a straight-line part that is parallel to the lens short axis and that intersects with the lens long-axis cross section, and has convex parts at both of its lateral sides; with this embodiment, the effect of the light distribution explained in the first embodiment is intensified for the light emitted from a light source center to directions in between the lens short axis and the lens long axis, and for an areal light source wherein the light source has a certain area.

Furthermore, a preferred embodiment is a light distribution lens, wherein a shape of the lens surface of the light emitting side in a plurality of cross sections taken along a plane parallel to the lens short-axis cross section has a straight-line part that is parallel to the lens short axis and that intersects with the lens long-axis cross section, wherein a continuous curved surface 8, through which the central optical axis passes, is formed from the collection of such straight-line parts along the curve of the light emitting side of the lens long-axis cross section, and wherein the length of said continuous curved surface in the long-axis direction viewed from the light emitting side is 8% or more of the length of the lens long axis.

Namely, as shown in FIGS. 3A, 3B, 3C(1), 3C(2), 3C(3), and 3C(4), the lens has a continuous curved surface which is provided in the shape of the light emitting side of a cross section parallel to the lens short-axis cross section, which is formed from the collection of straight-line parts parallel to the lens short axis and perpendicular to the lens long-axis cross section, and the length of this continuous curved surface in the plan view is 8% or more of the length of the lens long axis. In addition, the length of the straight lines parallel to the lens short axis, which constitute said curved surface, is preferably the largest on the lens short-axis cross section and gradually decreases as the distance between the cross section parallel to the lens short-axis cross section and the lens short-axis cross section increases; as shown in FIGS. 3A, 3B, 3C(1), 3C(2), 3C(3), and 3C(4), the straight line disappears at the position of the lens long-axis cross section.

The objective of this shape is as follows: in the lens surface having a straight-line part parallel to the lens short axis, as the straight-line part of a cross section parallel to the lens short-axis cross section moves outwards along the long axis, the length of this straight-line part decreases, and the state of the lens changes from the one wherein it acts as a concave lens having a diffusion action to the state of a convex lens having a light-converging action by the decreased straight-line part.

Here, a diffusion action means that, after the light beam passes through the lens, the angle formed between each of the light beam emitted from the light source and the lens central optical axis increases.

Accordingly, when viewing the three-dimensional shape of the lens surface of the light emitting side in terms of plan view, as one example, the continuous curved surface 8 becomes a shape close to a diamond having opposing corners on the lens long axis and short axis, as shown in FIG. 3B.

If the length of the straight-line part does not decrease as the distance between the cross section parallel to the lens short-axis cross section and the lens short-axis cross section increases, then a predetermined degree of collection of light cannot be achieved at lateral sides in the lens long-axis direction, and the amount of light decreases in the illuminance pattern in the long-axis direction of the illuminated surface, leading to a tendency of inhomogeneity. However, the ends of the continuous surface of the long axis side are not necessarily without a straight-line part, and the ends of the continuous surface of the long axis side may have a certain length in the direction perpendicular to the lens long-axis cross section.

Figure 4A:
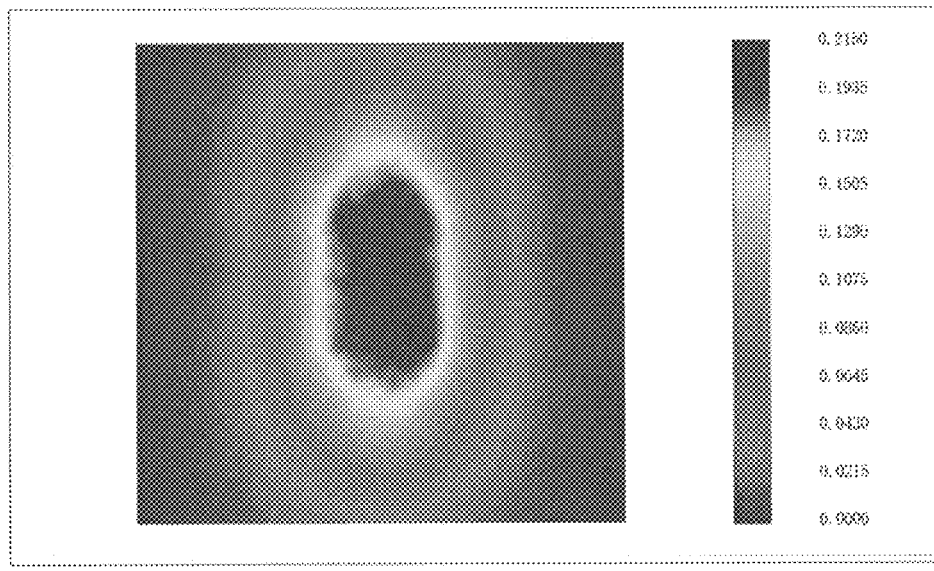
FIGS. 4A and 4B show an illuminance pattern and a light distribution characteristic diagram of a surface illuminated using the lens of FIGS. 3A, 3B, 3C(1), 3C(2), 3C(3), and 3C(4), according to some embodiments.
Figure 4B:
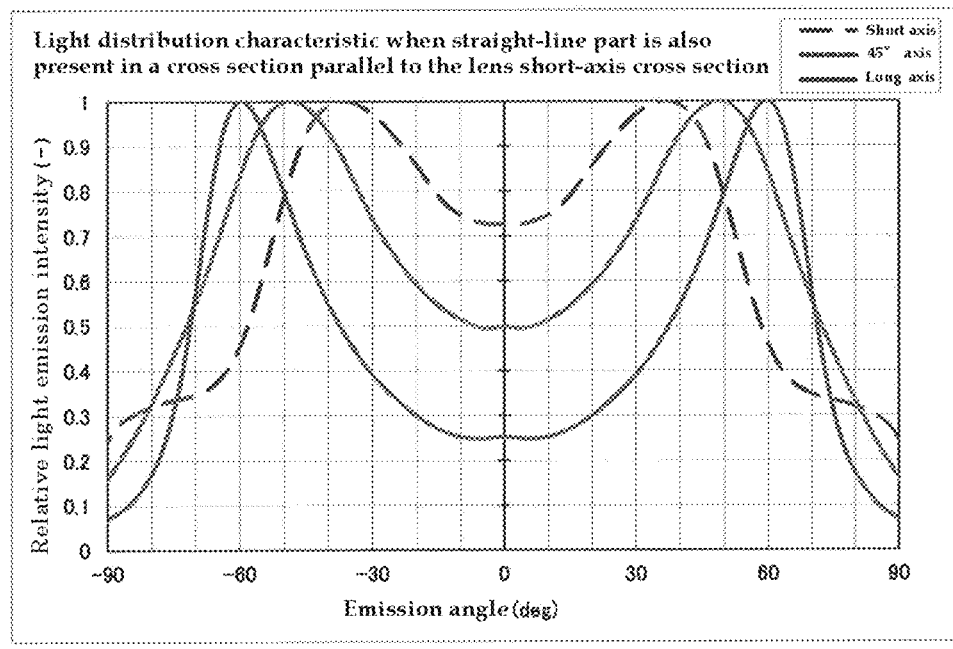

FIGS. 4A and 4B show an illuminance pattern and a light distribution characteristic diagram of a surface illuminated using the lens of FIGS. 3A, 3B, 3C(1), 3C(2), 3C(3), and 3C(4), according to some embodiments. FIG. 4A shows an illuminance pattern of the illuminated surface, FIG. 4B shows a light distribution characteristic diagram.

Regarding the illuminance pattern of the surface illuminated using this lens, as shown in FIGS. 4A and 5B, in addition to that a very homogeneous illuminated-surface can be obtained, the light distribution in the short-axis direction of the illuminance pattern is extended in a parallel manner in the long-axis direction of the illuminance pattern. Compared to the light distribution lens of the first embodiment, expansion in the short-axis direction of the outline of the illuminance pattern becomes more linear, and a homogeneous illuminance pattern having straight parts parallel to the long axis, like a 400-m running track, can be obtained, and it is possible to obtain excellent light distribution having a certain width in the short-axis direction and a certain length in the long-axis direction.

The continuous curved surface 8 may or may not be in a symmetrical position when viewed from the lens central optical axis, and also inclined to the lens short-axis direction as seen from the long-axis direction. In addition, a degree of this inclination may differ in different cross sections that are parallel to the lens short-axis cross section. For example, the straight-line part of the lens short-axis cross section is perpendicular to the lens long-axis cross section, and a straight-line part in a cross section parallel to the lens short-axis cross section has a slope in the short-axis direction, and the portions between the lens short-axis cross section and the cross sections parallel to the lens short-axis cross section may be formed such that these cross sections are connected by a continuous twisted surface, thereby forming a continuous curved surface. When an asymmetric elliptical illuminance pattern is desired in the short-axis direction of the illuminance pattern, the continuous curved surface can be appropriately adjusted.

The manner of connection with the convex part at lateral sides of the continuous curved surface may be discontinuously or smoothly connected, but it is preferable that they are smoothly connected. When they are smoothly connected, changes of refraction affecting the light distribution in the light due to discontinuously-connected part do not exist, and therefore bright portion and dark portion are not generated.

Regarding the three-dimensional shape of the lens surface of the light emitting side of the light distribution lens according to the second embodiment, when viewed in a plan view from the light emitting side, the shape appearing on the plan view of the continuous curved surface formed on the lens surface of the light emitting side by the collection of the straight-line parts parallel to the lens short axis, may be changed as appropriate depending on light distribution characteristics of illuminated surface.

Specifically, the straight line on the lens short-axis cross section is the longest, and the length of straight lines on cross sections parallel to the lens short-axis cross section may be arbitrary shorter than the former length. The width of the straight-line part in the short-axis direction is, at the widest, in the range of 5-40%, preferably 8-30%, and more preferably 10-20%, of the length of the short axis.

Length of the straight-line part in the direction of the lens long-axis cross section can be any length, and the straight-line part can be provided for the entire light emitting side; when the first embodiment is taken into consideration, in the present invention, the length is 0-100% relative to the length of the lens long axis; 8% or more is preferred in order to exhibit effects of the present embodiment. Preferably, it is in the range of 8-70%, and more preferably in the range of 10-50%.

Third Embodiment

FIGS. 5A(1), 5A(2), 5B(1), 5B(2), and 5B(3) are diagrams showing another example of the lens according to some embodiments. FIGS. 5A(1) and 5A(2) show an oblique perspective figure of the lens, FIG. 5B(1) shows a cross section (B3-B3 cross section) parallel to the lens short-axis cross section (B-B cross section) in FIG. 5A(1), FIG. 5B(2) shows one example of a cross section (B3-B3 cross section) parallel to the lens short-axis cross section (B-B cross section) in FIG. 5B(2), and FIG. 5B(3) shows the lens short-axis cross section (B-B cross section).

The light distribution lens according to the third embodiment of the present invention is a light distribution lens having, as shown in the oblique perspective figure of FIG. 5A(1), in addition to the continuous curved surface that is formed along the curve of the lens long-axis cross section of the light emitting side and that includes straight lines parallel to the lens short axis, a second curved surface 8*b* consisting of a collection of straight lines parallel to the lens short axis, which does not include the lens central optical axis position, wherein the second curved surface 8*b* is formed at a position in the convex part of the lens long-axis cross section, distant from the first curved surface 8*a*.

With the first curved surface including the lens central optical axis position, effects similar to those by the second embodiment can be obtained. Furthermore, the light distribution lens of the third embodiment enables the following effect: in this lens, the second curved surface without including the lens central optical axis position is formed at a position in the convex part of the lens long-axis cross section, distant from the first curved surface, which leads to a decrease in the light distribution at the tip of the illuminance pattern of the illuminated surface in its long-axis direction (A-A direction) and a corresponding increase in the light distribution at directions away from the long-axis direction (the direction represented by C-C in FIGS. 3A and 3B; hereinafter, the (C-C direction) refers to the same meaning as in FIGS. 3A, 3B, 3C(1), 3C(2), 3C(3), and 3C(4)), thereby enabling a illuminance pattern having a large curvature in the C-C direction by decreasing the curvature in the A-A direction. That is, an illuminance pattern wherein the illuminance pattern of the 400-m running track of the second embodiment is brought close to a rectangle shape (a rectangle with rounded corners) is achieved.

The position in the convex curve of the lens long-axis cross section at which the second curved surface is provided, distant from the first curved surface, is preferably located at lateral sides of peaks of double-peak shape in the lens long-axis cross section. The light emitted from the lateral-side region of the peaks in the lens long-axis cross section is mainly distributed to the tips in the A-A direction, and this is the factor determining the curvature of the illuminance pattern in the A-A direction; therefore, in order to decrease this curvature and to direct the emitted light to the C-C direction, it is preferable to provide a second curved surface consisting of a collection of straight lines parallel to the lens short axis at lateral region of the peaks of the double-peak shape, thereby refracting the light emitted in the A-A direction toward the C-C direction.

The cross-sectional diagram in FIG. 5B(1) shows an arbitrary B3-B3 cross-sectional diagram, when the second curved surface is a curved surface having straight lines parallel to the short axis.

FIG. 5B(3) shows the first curved surface in the lens short-axis cross section.

Furthermore, it is also possible to provide a groove-shaped recess in the second continuous curved surface. In this case, in a cross section parallel to the lens short-axis cross section (B3-B3 cross section in FIG. 5A(2)), the recess is represented by the cross section having a concave curve 1d as shown in FIG. 5B(2), wherein the bottom of the concave curve is located at the position perpendicular to the lens long-axis cross section. Namely, the curve along the bottom center of the groove is included in the plane of the lens long-axis cross section. By providing such a groove-shaped recess in the second continuous curved surface 8b, the emitted light directed to the A-A direction is significantly diffused in the C-C direction, thereby obtaining desired illuminance pattern in the long-axis direction of the oval illuminance pattern, and also reducing the curvature in the A-A direction. In some cases, straight lines parallel to the short axis may not be included in the second continuous curved surface.

Here, the curve 8c along the bottom center of the groove is preferably along the curve formed by the convex part of the lens long-axis cross section; however, depending on the light distribution desired, it may not be along the curve formed by the convex part.

Fourth Embodiment

FIGS. 6A, 6B(1), 6B(2), and 6B(3) are diagrams showing another example of the lens according to some embodiments. FIG. 6A is an oblique perspective figure of the lens illustrating a notch appearing on the convex part, and FIGS. 6B(1)-(3) show a partial diagram of the cross section along the long axis of the lens with a notch. The light distribution lens according to the forth embodiment of the present invention is a light distribution lens having, as shown in FIGS. 6A, 6B(1), 6B(2), and 6B(3), in the convex curve of the lens long-axis cross section of the light emitting side, a notch at points on the convex curve at which a line connecting the light source center and the points on the convex curve coincides with the normal lines of the convex curve at the points, and wherein said notch is provided starting from the convex curve along the normal lines, either with a convex-curve portion outside (i.e. the side far from the lens central axis) of the normal lines being concave, or a convex-curve portion outside of the normal lines being convex, thereby providing a second continuous curved surface including straight lines parallel to the short axis, at the convex part that is in contact with the notch and outside of the normal lines.

Namely, in a plane including the lens central optical axis 4 and light beams emitted from the light source center 10 to the convex part, the emitted light at the position of intersection at which the line connecting the light source center and the convex curve is a normal line of the convex curve at that point, travels straight without being refracted regardless of the presence of a lens. The locus of the similar emitting light that appears as a normal line of the convex curve on the curved surface forms a conical surface of a virtual cone rotated about the lens central optical axis as shown in FIG. 6A, when the curve is consisted of mostly similar curves; and an arc locus 12 is drawn on the lens surface as continuation of points where the emission light beam 13 is orthogonal to the tangent line of the convex curve. The apex angle of this virtual cone will vary according to the shape of the convex curved surface at the point where the beam 13 intersects upon rotation. In this way, in each of the planes including the lens central optical axis 4 and a light beam emitted from the light source center 10 to the convex part, as the curve shape is changed, the points, at which a light beam emitted from the light source center is normal to the convex curve of the convex part, appear as the locus 11 in the convex part of the lens while changing its height from light incident side plane.

In addition, when the light distribution lens is mirror symmetry about the short-axis cross section, the locus 12 is also present on the surface of the convex part of the opposite side.

Near the lens long-axis cross section, a notch 9 of FIG. 6B is provided along the arc locus 12 on the convex surface. FIGS. 6B(1)-(3) show partial cross-sectional views along the lens long axis showing the notch 9, wherein the light emitted from the light source center coincides with the normal line and the notch is formed along the normal line. One example is shown in FIG. 6B(1), wherein the notch 9 is provided such that the convex lens shape outside of this arc locus is made to be recessed. Other examples are shown in FIGS. 6B(2) and (3), wherein the notch 9 is provided such that the convex lens shape outside of this arc locus is made to be projected. And preferably, the lens surface outside of the arc locus has a continuous curved surface including straight lines parallel to the lens short axis, wherein this curved surface is also perpendicular to the lens long-axis cross section.

The notch appearing in the lens long-axis cross section shown in FIG. 6B(1) is explained. At the point on the convex curve at which a line connecting the light source center and this point coincides with the normal line of this point of the convex curve, a notch 9 is provided from this point along the normal line such that the convex shape outside of the normal line (opposite to the lens central optical axis) is recessed. The recessed curve due to the notch further connects to the lower convex part, and at this portion of the recessed curve, there is a continuous curved surface that includes straight lines parallel to the lens short axis, and that is also perpendicular to the lens long-axis cross section.

Thus, in the lens long-axis cross section, the tangent line of the recessed curve due to the notch inclines further to the optical axis compared to the tangent line of a convex curve without a notch, and therefore the light from the light source center spreads at this curved surface, leading to an increase in the light to the A-A direction without increasing the size of the lens; in addition, since the continuous curved surface includes straight lines parallel to the lens short axis, the light distribution at the tip of the A-A direction in the oval illuminance pattern is extended in the C-C direction by this light distribution lens.

The notches appearing in the lens long-axis cross section shown in FIGS. 6B(2) and (3) are explained as follows. At the point on the convex curve at which a line connecting the light source center and this point coincides with the normal line of this point of the convex curve, a notch 9 is provided from this point along the normal line such that the convex shape outside of the normal line (opposite to the lens central optical axis) is expanded. The expanded curve due to the notch further connects to the lower convex part, and at this portion of the expanded curve, there is a continuous curved surface that includes straight lines parallel to the lens short axis, and that is also perpendicular to the lens long-axis cross section.

Thus, in the lens long-axis cross section, the slope of the tangent line of the expanded curve due to the notch is larger than that of the tangent line of a convex curve without a notch, and therefore the light from the light source center is refracted at this curved surface towards the central optical axis side, leading to a decrease in the light distribution to the A-A direction in the illuminance pattern, and the curvature of the semi-circular shape in the A-A direction decreases in the illuminance pattern. In addition, since the light in the A-A direction is shifted to the C-C direction, in the track-shaped illuminance pattern the curvature in the A-A direction decreases and that in the C-C direction increases; as a result, an illuminance pattern close to a rectangle with rounded corners is obtained by this light distribution lens. In the case of FIG. 6B(3), the slope of the tangent line of the lens curved surface rising from the lens edge of the light incident side is more than 90° relative to the lens surface of the light incident side (horizontal), which inclines outwardly, whereas in the cases of FIGS. 6B(1) and (2), the slope of the tangent line is 90° or less, which inclines to the central optical axis side (inwardly); accordingly, the light beams of FIG. 6B(3) emitted from the light source center horizontally or at a shallow angle from the horizontal line can also be refracted towards the lens central optical axis side, so that conventional stray light can also be effectively utilized.

The length of the notch provided along the arc locus in the convex part that includes the lens long-axis cross section can be adjusted as desired. Preferably, when viewed in a plan view, the angle between the two lines connecting both edges of the notch and the light source center) is 2-70°, preferably 3-60°, more preferably 5-50°.

The continuous curved surface provided outside the normal line may not include a straight line parallel to the short axis, if desired. In addition, similarly to the second continuous surface of the third embodiment, it may include a groove-shaped recess in which the longitudinal direction of the groove and its bottom center coincides with that in the long-axis cross section.

Fifth Embodiment

FIGS. 7A, 7B(1), and 7B(2) are diagrams showing another example of the lens according to some embodiments. FIG. 7A shows an oblique perspective figure of the lens, FIG. 7B(1) shows the lens short-axis cross section (B-B cross section), and FIG. 7B(2) shows the lens long-axis cross section (A-A cross section). The light distribution lens according to the fifth embodiment of the present invention is a light distribution lens, wherein as shown in FIGS. 7A, 7B(1), and 7B(2), in the shape of the lens long-axis cross section, the shape of the light emitting side has a straight-line part parallel to the long axis with a length of less than 5% of the length of the long axis, at and near the lens central optical axis position, and the shape is concave at both of its lateral sides, and is convex at furthermore lateral sides.

Namely, the three-dimensional shape of the lens surface includes a straight-line part perpendicular to the lens central optical axis, in both the long-axis and short-axis cross sections at and near the lens central optical axis position.

The light distribution lens according to the fifth embodiment of the present invention has preferably, as shown in FIGS. 7A, 7B(1), and 7B(2), a part that includes straight lines parallel to each of the lens long axis and lens short axis, i.e., a planar part; as desired, the lens has a surface 14 in which the planar part is smoothly connected to a curved surface part that includes the convex curve on the lens short-axis cross section, formed by a collection of straight lines parallel to the lens long axis. FIGS. 7B(1) and 7B(2) show lines 1a and 1c appearing at the light emitting side of the lens short-axis cross section and the lens long-axis cross section, respectively.

Figure 8A:
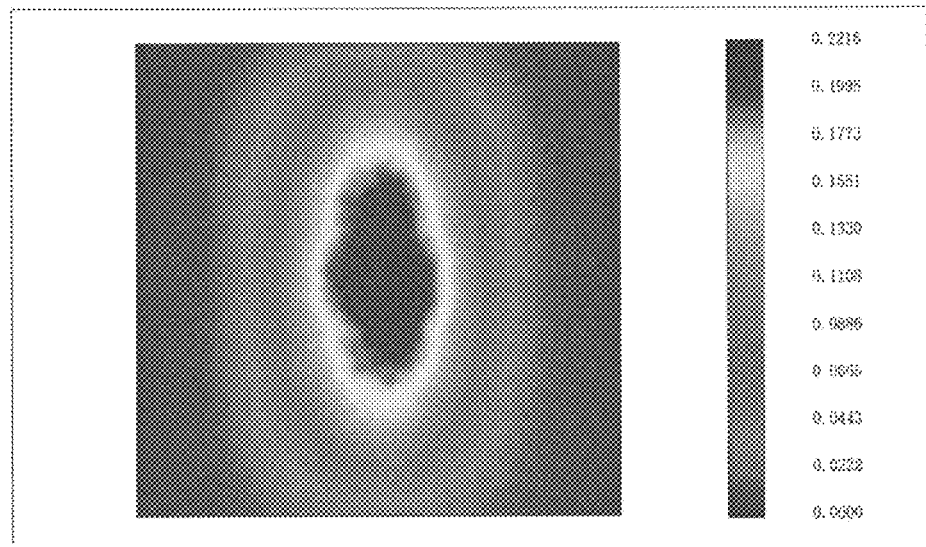
FIGS. 8A and 8B show an illuminance pattern and a light distribution characteristic diagram of a surface illuminated using the lens of FIGS. 7A, 7B(1), and 7B(2), according to some embodiments.
Figure 8B:
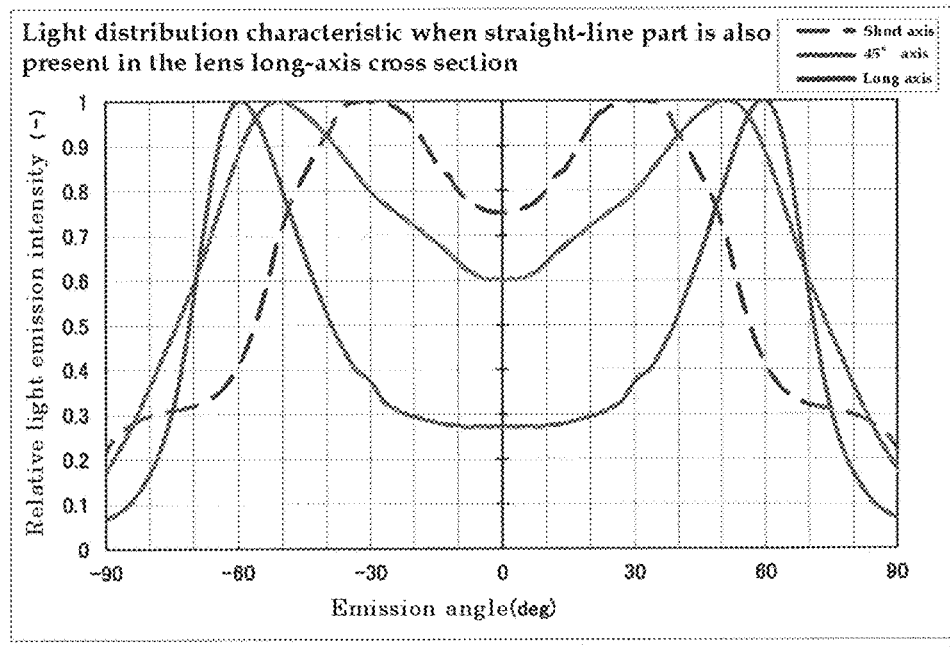

FIGS. 8A and 8B show an illuminance pattern and a light distribution characteristic diagram of a surface illuminated using the lens of FIGS. 7A, 7B(1), and 7B(2), according to some embodiments. FIG. 8A shows an illuminance pattern, FIG. 8B shows a light distribution characteristic diagram. FIGS. 8A and 8B shows an illuminance pattern and light distribution characteristics of an illuminated surface. FIG. 8A shows that the following illuminance pattern, i.e., in an oval and homogeneous illuminance pattern having a width in the short-axis direction which is elongated in the long-axis direction, a circular region with relatively high illuminance near the light central optical axis is superimposed, is obtained. The illuminance pattern having a relatively high-illuminance circular region near the light central optical axis is realized by smoothly-diffused oval-shaped light distribution on which a circular illuminance pattern is superimposed, wherein the circular illuminance pattern is achieved as follows: a light emitted from the light source center penetrates through a small planar part at and near the lens central optical axis position of the light emitting side, so that the light is emitted radially within a small angle.

When the area of this planar part is too large, the area of the convex part at the center of the long-axis cross section decreases, and emitted light does not spread to the long-axis direction; therefore, the length of the straight lines is preferably 5% or less relative to the length of the long axis. The planar part may be inclined relative to the short axis and/or long axis.

Here, in order to avoid the light to be converged in the vicinity of the lens central optical axis, by providing a recess that includes the lens central optical axis within the planar part including this lens central optical axis, strong emission light in the immediate vicinity of the lens central optical axis is diverged in the long-axis and short-axis directions, thereby eliminating the light distribution with extreme luminance intensity in the immediate vicinity of the lens central optical axis and further smoothing the circular light distribution having relatively high intensity, which is superimposed on the smoothly-diffused oval-shaped light distribution.

Sixth Embodiment

FIGS. 9A, 9B(1), and 9B(2) are diagrams showing another example of the lens according to some embodiments. FIG. 9A shows an oblique perspective figure of the lens, FIG. 9B(1) shows the lens short-axis cross section (B-B cross section), and FIG. 9B(2) shows the lens long-axis cross section (A-A cross section). In the light distribution lens according to the sixth embodiment of the present invention, as shown in FIGS. 9A, 9B(1), and 9B(2), the lens surface of the light emitting side expands upward and outward from the outline of the lens base plane of the light incident side, to form a three-dimensional shape that includes a convex shape.

Namely, the projected area of the light distribution lens viewed from the light emitting side is larger than that of the lens viewed from the light incident side which includes the lens long and short axes, due to the expansion of the convex shape in the horizontal directions.

As seen in the first to fifth embodiments, generally, a convex curved surface is raised from the outline of the lens surface including the lens long and short axes of the light incident side, wherein the angle between the rising of the lens and the plane including the lens short and long axes is usually 90° or less; however, in the light distribution lens shown in FIGS. 9A, 9B(1), and 9B(2), this angle is more than 90°, so that a part of the three-dimensional shape is formed by an expanded outline from the outline of the lens surface of the light incident side.

Thus, the outline of the projection plane of the light distribution lens viewed from the light emission side when it is maximally expanded in the horizontal directions, is present at outside periphery of the outline of the lens surface of the light incident side. Since the angle between the tangent line 15 of the convex curve at and in the vicinity of the rising portion of the lens long-axis cross section including the lens central optical axis, and the plane including the lens short and long axes, exceeds 90°, even the light beams emitted from the light source center horizontally or with a shallow angle from the horizontal line can also be refracted towards the lens central optical axis side, so that these lights which have not been conventionally utilized can be effectively utilized.

The point at which an angle between the tangent line 15 on the convex curve in a plane containing light beams emitted from the lens central optical axis and the emission center, and the plane including the lens short and long axes becomes 90° (i.e., the point at which the vertical tangent line intersects on the curved surface maximally expanded in the horizontal directions) can be represented as a locus 17 around the convex curved surface of the lens. The height on the convex curved surface of the lens at which this diagonal angle exceeds 90° can be represented by the height of the locus 17 from the lens surface of the light incident side, which can be selected as desired. It is preferable to set the locus 17 on the lens convex part, in terms of the angle between the locus 17 and the central optical axis with the light emission center as the center point, in the range of 70°-90° and preferably 75°-85° in the long-axis direction, and in the range of 50°-80° and preferably 60°-75° in the short-axis direction. When this angle is set to be too small on the convex part so that the locus is set at an excessively high position, it influences the designed effective illuminance pattern of the three-dimensional shape of the light emitting side, and the designed light distribution is impaired.

In lens cross sections including the central optical axis, the shape of the convex part of the light emitting side, which is linked to the outline of the lens of the light incident side, may be a convex curve, a straight line, or a combination thereof. A curve having different curvatures is preferable.

Seventh Embodiment

Regarding the three-dimensional shape of lens surface of the light emitting side, additional or preferably-adopted embodiments are described. When the connection between convex part and concave part is discontinuous, this discontinuous portion causes discontinuous refraction of light, leading to appearance of bright part and dark part in the light distribution, which may be reflected on an illuminated surface.

In the light distribution lens according to each of the above embodiments of the present invention, the three-dimensional shape of the light emission side lens surface may have a discontinuous connection between straight-line parts, convex parts and concave parts, but preferably the lens surface has an overall smooth continuous curved surface.

When a lens surface has a notch, preferably the three-dimensional shape of the light emission side lens surface is a smooth continuous curved surface except the notch.

In the lens short-axis cross section including a straight line parallel to the lens short axis and in a cross section parallel thereto, the convex part at both lateral sides of the straight line parallel to the lens short axis may be an arc consisting of a simple circle; but the convex part preferably comprises a convex curve having a non-constant curvature, consisting of a combination of curves with different curvatures. In the case of a simple arc-like curve, it is difficult to achieve smoothly-diffused light distribution on the entire illuminated surface. In the convex part without having a straight line parallel to the lens short axis, an aspheric surface is preferable. In the lens short-axis cross section including the lens central optical axis, it is preferable that the straight line is the longest compared to other straight lines in other cross sections, and therefore, the convex curves in both lateral sides may be a more arc-like convex curve compared to the curves of other positions. Convex curves that constitute the convex shape may be a combination of straight lines inserted between convex curves and outside of the curves, as required.

In the light distribution lens of the present invention, an "outline surface" may be provided on the outline portion in the plan view of the lens.

An outline surface may have the lens outline in such a way that a plane including a straight line substantially parallel to the lens central optical axis is surrounding the all or part of the lens edge, just like a wall.

For example, as shown in FIGS. 1A, 3A, 3C, 5A, and 5B(3), the lens short-axis cross section includes a straight line rising from the B-B axis near the portion in contact with the B-B axis. The surface including this straight line forms an outline surface like a standing wall at the lens edge. This straight line may be parallel to the lens central optical axis, may be inclined outwardly or inwardly; however, it is preferable that the straight line is parallel to the central optical axis or inclined outwardly. A wall-like outline surface may be, for example, provided in a part of the periphery of the lens to cut expansion in its width direction, or provided in the entire periphery of the lens to surround the entire lens.

By defining the lens outline using this outline surface, it is possible to avoid an excessive increase in the planar area of the lens, and to appropriately adjust the shape of the lens. Moreover, lenses can be densely arranged on a circuit board.

The light distribution lens of the present invention may be asymmetric about the lens short-axis cross section, or may be asymmetric about the lens long-axis cross section; when a plurality of lenses are arranged, such asymmetric light distribution lenses can be used to correspond to the illuminated surface having corners or steps. Generally, it is convenient and easy to use a light distribution lens wherein the three-dimensional shape of the lens surface of the light emitting side is mirror symmetry about each of the lens short-axis cross section and lens long-axis cross section which are perpendicular to each other and include the lens central optical axis.

In the case when the lens is asymmetric, since asymmetry is difficult for human eyes to recognize, it is convenient to put asymmetry indication on the surface where the indication makes no harm to the light distribution, such as the light incident plane.

In the light distribution lens of the present invention, a part or entire surface of the light incident side or light emitting side may be subjected to antifogging treatment. The surface may have a Fresnel shape.

Eighth Embodiment

The eighth embodiment relates to a lens shape of the light incident side of the light distribution lens. The lens shape of the light incident side of the light distribution lens according to the present invention is not particularly limited, as far as the light distribution of interest is not impaired, and it may be a flat surface, a concave surface, or a convex surface, and it may have small irregularities engraved.

FIGS. 12A, 12B(1), and 12B(2) show a lens of one example, according to some embodiments. FIG. 12A shows an oblique perspective figure of the lens viewed from the light incident side, FIG. 12B(1) shows the lens short-axis cross section (B-B cross section), and FIG. 12B(2) shows the lens long-axis cross section (A-A cross section). The preferred eighth embodiment of lens shape of the light incident side is shown in FIGS. 12A, 12B(1), and 12B(2). As shown in an oblique perspective figure of FIGS. 12A, 12B(1), and 12B(2), a dome-shaped escape recess 19 through which the lens central optical axis passes is formed, which serves as the escape recess to house a part of a light emitting element, a sealing member for the light emitting element, and a base board on which these are placed. The reason for adopting the dome shape is to enable housing a light source comprised of a hemispherical sealing body as the sealing part of light emitting element. In addition, by using a hemispherical dome, the light emitted from the light source center is not affected by optical refraction, and therefore effect of the three-dimensional shape of light emitting surface on the design is decreased. Furthermore, upon injecting an adhesive into the escape recess, air may be entrained along with the adhesive; in such cases, when a light emitting element is pushed into the escape recess that has been filled with an adhesive, the entrained air may better be released together with overflowing excess adhesive, and this dome shape increases such a chance. Shape of the escape recess is not limited to a dome shape, and can be varied as appropriate corresponding to the shape of LED package and LED light source.

This escape recess preferably has a size sufficient to accommodate the mold volume, when the light emitting element is sealed by hemispherical mold. The size of the dome-shaped escape recess relative to the hemispherical sealing body is, preferably 10% to 15% greater in the height than the hemispherical sealing body.

Also, when a light emitting element is pushed into the escape recess that has been filled with an adhesive or filler, an excess adhesive overflows; accordingly, it is preferable to provide a liquid escape recess 20 to store the overflowed adhesive or filler. By providing a liquid escape recess 20, adhesive or filler overflowing from the escape recess would not affect optical properties of the lens and subsequent works. A depth of the liquid escape recess is set to be slightly shallower than that of the escape recess so as not to affect optical properties, and preferably liquid escape recesses with a sufficiently large area are provided in four directions in order to ensure sufficient volume.

In addition, when an LED package is pushed into the escape recess that has been filled with an adhesive or filler, in order to prevent the LED package from entering the escape recess or liquid escape recess more than necessary, an insertion stopper 21 to stop the LED package at a predetermined depth relative to the lens is preferably provided, wherein the insertion stopper is arranged on a rack-like land formed at a position slightly shallower than the bottom of the liquid escape recess.

Since the base or casing of the LED package is secured when it hits the insertion stopper 21, the light source can be kept at a constant height relative to the lens. The form of insertion stopper 21 is not limited as long as it has a mechanism to stop LEDs in a stable manner with good reproducibility. It may be a pin-shaped, or may be provided in a trapezoidal shape on the bottom surface of the liquid escape recess.

The outline shape of liquid escape recess seen from the light incident side may be provided in any shape, for example, a polygonal shape, a star shape with radially-arranged convex portions, or a shape with rounded angles thereof. As another feature of the outline shape of liquid escape recess, it is preferable to have a lateral-displacement preventing function, with which lateral displacement of the light source such as LED package within a lens is eliminated and the light source is fixed at a predetermined position. For example, if the base or casing of an LED package is square when viewed from the optical axis direction, when a portion of the base or casing of the LED package is inserted into a liquid escape recess, it is preferable for the liquid escape recess to have a shape, with which the base or casing is inserted while it is in contact with the outline of the liquid escape recess, and at the same time the four sides or corners of the base or casing of the LED package can be fixed by walls that form the outline of the liquid escape recess (lateral-displacement preventing walls 21a and 21b).

Ninth Embodiment

The ninth embodiment relates to a light emitting device which is a combination of a light distribution lens and a light source.

Figure 14A:
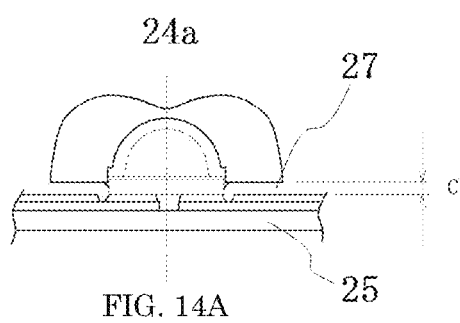
FIGS. 14A and 14B show cross sections of one example of light emitting device, according to some embodiments.
Figure 14B:
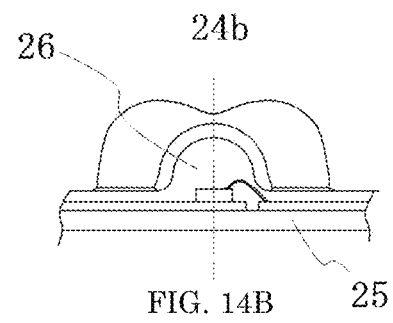

FIGS. 14A and 14B show cross sections of one example of light emitting device, according to some embodiments. FIG. 14A shows an example of a cross section along the long axis of the light emitting device, and FIG. 14B shows another example of a cross section along the long axis of the light emitting device. It relates to a light emitting device 24a, wherein an LED package integrated by combining the light distribution lens according to each of the above-mentioned embodiment is disposed on a circuit board, and to a light emitting device 24b, wherein a light distribution lens is fixed on and integrated with the light source that is an LED package directly formed on a circuit board by placing a light emitting element (chip) on the circuit and by sealing its periphery.

The LED package as a light source is either one of the following: one independent package wherein a light emitting element (chip) is placed on a casing, and after connecting the element and an electrode, the casing is sealed with transparent resin while terminals of the electrodes are exposed to the outside of the casing; or one independent package that is a so-called COB-type LED package, wherein an electrode circuit is provided on a plate-like base (board) such as ceramic, a light emitting element (chip) is placed on the electrode circuit, the electrode and the light emitting element are connected, and a hemispherical sealing body is provided by potting with a transparent resin or glass on the light emitting element including the connecting wire; as another light source, a light emitting element (chip) is placed on a circuit board of a thin metal-film circuit (printed-circuit board), the chip is connected to the circuit, and the periphery of the light emitting element is sealed with a transparent resin, thereby making the light source directly on the circuit board; this is a so-called chip-on-board (COB) circuit board.

FIGS. 13A(1), 13A(2), 13A(3), 13B(1), 13B(2), and 13b(3) show cross sections illustrating the integration of the lens of FIGS. 12A, 12B(1), and 12B(2) with an LED package, according to some embodiments. FIGS. 13A(1)-(3) show illustration diagrams in terms of the lens short-axis cross section, and FIGS. 13B(1)-(3) show illustration diagrams in terms of the lens long-axis cross section. FIGS. 13A(1), 13A(2), 13A(3); and, 13B(1), 13B(2), and 13B(3) show short-axis and long-axis cross sections of LED package with lens, respectively, wherein an LED package 22 is fitted in an escape recess of the light incident side of a light distribution lens, and the gap 23 between the hemispherical sealing body of the LED package and the liquid escape recess is bonded and fixed with a transparent adhesive.

FIGS. 14A and 14B are cross-sectional views of the light emitting device 24a, wherein an LED package with a lens is placed on a circuit board 25 and is fixed via a reflow process onto the circuit board 25.

In the light emitting device shown in FIG. 14A, preferably a gap 27 is provided between the lens surface of the light incident side and the circuit board on which the LED package is placed. By this gap, for example, it becomes possible to prevent positional displacement of the lens due to a difference in the thickness of soldering generated during reflow process, as well as to prevent the contact between the lens and the board caused by irregularities around the lens on the circuit board, so as to provide flexibility in the directional adjustment of the lens optical axis. FIG. 14B is a cross-sectional view of the light emitting device 24b, wherein a chip-on-board hemispherically-sealed emission light source part is provided in advance on the position of the circuit on a printed-circuit board at which a light source is to be provided, then a light distribution lens is bonded to the sealing part. A plurality of emission light source parts can be provided on a single circuit board.

Tenth Embodiment

The tenth embodiment relates to a light emitting device that is assembled without using an adhesive FIGS. 15A(1), 15A(2), 15A(3), 15B(1), 15B(2), and 15B(3) show cross sections of another example of light emitting device according to some embodiments. FIG. 15A shows a case wherein fitting is carried out on the base side of an LED package, FIG. 15B shows a case having legs. The uppermost diagrams are cross-sectional views of a fitted state, middle diagrams are cross-sectional views before fitting of the lens, and lowermost diagrams show the lens planes viewed from the light incident side. When integrating light distribution lens and LED using an adhesive, while there is an advantage to suppress a decrease in the light extraction efficiency due to difference in refractive index because an air layer between the LED package and the escape recess is eliminated, the process becomes complicated, and there is also a disadvantage that inadvertent contamination is easily caused by uncured adhesive. If a large number of light distribution lenses can be fixed without bonding process, it will be a great advantage.

FIG. 15A shows light emitting device 30a in which, an LED package with a lens wherein the lens is integrated with the LED package by a fitting mechanism, is bonded and fixed on a circuit board by reflow process.

As shown in FIG. 15A, a wedge-shaped fitting-receiving recess 35 is provided on the side of the base such as ceramic base of the LED package, and in the lens, a pawl 32 to be fitted to the base of the LED is provided in a protruded manner on the lateral side of the LED base, and the pawl 32 is fitted into the fitting-receiving recess 35 on the side of the base by means of deformation of the lens, and fixed thereto. With these fitting mechanisms, positions of the light source and the lens can be determined with good dimensional accuracy.

FIG. 15B shows light emitting device 30b in which a lens is positioned and fixed on a circuit board equipped with a COB-type LED light source, by means of one-touch operation of the fitting mechanism.

As shown in FIG. 15B, the lens is provided with a leg 31 which fits into a hole 34 drilled in a circuit board 25, and is also provided with a pawl 32 at the tip of the leg 31 for fitting, and an alignment part 33 at the leg base for alignment of the lens height relative to the circuit board. The pawl 32 is made such that once it fits in the hole of the circuit board, it never comes off. The alignment part 33 has a function similar to the insertion stopper 21 of LED packages, to prevent the leg from entering too deep in the hole. Preferably, the legs are provided at minimum 2 points. Also, the leg may be a part of the lens body, or the leg may be formed with a different material and then integrated with the lens body. In addition, the alignment part 33 may be provided in a ring shape on the light incident side of the lens. Furthermore, even when this fitting mechanism is adopted, the gap between the light source and the escape recess of the lens may be filled with an adhesive as required.

FIGS. 16A, 16B, and 16C show cross sections of another example of light emitting device according to some embodiments. The upper diagram (FIG. 16A) is a cross-sectional view of a fitted state, middle diagram (FIG. 16B) is a cross-sectional view before fitting of the lens, and lower diagram (FIG. 16C) is the lens plane viewed from the light incident side. As such, FIGS. 16A, 16B, and 16C shows a light emitting device wherein a lens in which a ring-shaped ridge seal body is provided on the light incident surface is fitted in a circuit board.

As shown in FIGS. 16A, 16B, and 16C, on the lens light incident surface, the ring-shaped ridge seal body is provided to surround an escape recess, and this seal body is rubber elastic, has a height that is crushed by fitting the leg 31 to the circuit board, and tightly crimps liquid-tight between the lens and the circuit board by a fitting action. Because of this, the gap between the LED and the lens, joint surfaces of LED reflow soldering, and the exposed circuit are blocked from the outside atmosphere, so that when the light emitting device is used as a device exposed to outside air, such as street lights and tunnels and external signs, condensation and dust adhesion can be prevented, and the device can contribute to the prevention of disturbance on the light distribution due to condensation and the prevention of corrosion of circuits near LED. The ridge seal body may be integrally molded with the same material as the lens material, or it may be composed of another material of different hardness; the material may be any material with a certain persistent elasticity to withstand long-term use, having a moderate repulsive force that does not damage the leg 31 and pawl 32. Preferably, gel-like rubber with a Shore A hardness of 80 or less may also be used. More preferably, the rubber with a Shore A hardness of 10 to 80 is preferred. Its planar shape may be elliptical, polygonal etc., that enables to surround LED, exposed circuit in its vicinity and reflow soldering contacts in accordance with the lens shape of the light incident side. A ridge shape in the cross-sectional shape of the seal body may be a pointed mountain shape, semicircular, a trapezoid or rectangle, and the height may be a larger size than the alignment part 33. Also, by using a repulsive force of the ridge seal body, it is also possible to obtain a desired gap C without the alignment part 33.

Eleventh Embodiment

The eleventh embodiment relates to a method of manufacturing a light distribution lens according to each embodiment and a light emitting device using the light distribution lens. The method of manufacturing a light distribution lens is by metal molding. As the metal molding method, various methods including injection molding, pressing, cast molding, etc., can be used without any particular limitation. In a preferred embodiment, a mold carved with a three-dimensional shape of the light emission side is used as the lower mold, and a mold carved with a shape of the light incident side is used as the upper mold, and a lens material is filled into the lower mold of light emitting side, which is then pressed with the upper and lower molds while heating for molding. Several tens to several hundreds of lens dies are carved on one surface of this mold to achieve efficient production of the lens.

When the lens has a shape that is not separated from a mold, such as notch on the light emitting side and liquid escape recess and fitting mechanism on the light incident side, the lens can be molded using upper and lower molds further divided into a plurality of pieces. In addition, focusing on the hardness of the lens material and by selecting a slightly flexible rubber material, it is possible to forcibly take out the lens from the mold using deformation of the material.

The method of manufacturing a light emitting device that comprises a circuit board on which a light distribution lens according to the above embodiments and a light emitting element are placed, is a method of manufacturing a light emitting device, comprising any of the following steps (1), (2) and (3):

(1) a step of preparing an LED package in which a semiconductor light-emitting element (chip) electrically connected to electrode terminals is sealed with a transparent material, a step of preparing a light distribution lens having an escape recess and a liquid escape recess on the lens surface of the light incident side, a step of filling the escape recess with an adhesive, a step of bonding the adhesive-filled part to the sealing part of the LED package by pressing them each other while the light emission center matches the central optical axis of the lens, a step of curing the adhesive, and a step of placing and fixing the LED package on a circuit board. That is, (1) is a method of manufacturing a light emitting device using a separate independent LED package.

The light distribution lens of the present invention is integrated with one separate LED package by bonding, and this LED package is placed on a circuit board and fixed. The method of fixing an LED integrated with a lens on a circuit board is by reflow soldering. Also, there is another method wherein an LED is first fixed to the circuit board by reflow process, then a lens is bonded to the LED package on the circuit board.

In FIGS. 13A(1), 13A(2), 13A(3), 13B(1), 13B(2), and 13b(3), the following step is also schematically shown: in the lens short-axis and long-axis cross sections, a step of bonding the adhesive-filled escape recess of the lens and the sealing part of the LED package by pressing them such that the emission center and the lens central optical axes coincide. The LED package is one in which a light emitting element is hemispherically sealed on a rectangle base, and the lens has a shape of the light incident side shown in FIGS. 12A, 12B(1), and 12B(2). Namely, the escape recess is larger than the hemispherical sealing body of the LED package. Also, in order to prevent the LED package to be excessively pushed into the lens, an insertion stopper 21 is provided, which controls the insertion depth when the base hits the stopper. As a result, as shown in FIGS. 13A(1), 13A(2), 13A(3), 13B(1), 13B(2), and 13b(3), a gap 23 is formed in which an adhesive 23 is present. This gap eliminates a trouble occurring in the optical axis due to the contact between the sealing body and the escape recess.

Furthermore, a wall of each of the four sides (A-A direction and B-B direction) of the liquid escape recess is just in contact with each of the four sides of the casing or base of the LED package, so that this mechanism can prevent lateral displacement of the LED and enables matching of the lens central optical axis with the emission center. Although the depth to which the LED package is pushed into the lens is adjusted properly by an insertion stopper, preferably, when the lens and the circuit board are integrated as a light emitting device by reflow soldering, etc., a portion in the thickness direction of the base plate or casing of the LED package is present outside the lens incident surface, to such an extent that a gap C is provided between the circuit board and the surface of the lens light incident side, as shown in FIG. 14A. By providing such a gap, it is possible to reduce the influence of changes in the amount of reflow soldering. The width of the gap C is preferably 0.25 mm to 0.7 mm.

(2) A step of placing a semiconductor light-emitting element (chip) on the circuit of a circuit board, electrically connecting the light-emitting element (chip) to the circuit, to produce the circuit board having a chip-on-board LED light-emitting source, a step of preparing a light distribution lens having an escape recess and a liquid escape recess on the lens surface of the light incident side, a step of filling the escape recess with an adhesive, a step of bonding the adhesive-filled part to the LED light-emitting source by pressing them each other such that the emission center of the semiconductor light-emitting element matches the central optical axis of the lens, and a step of curing the adhesive.

Specifically, (2) is a method of manufacturing a light emitting device by placing a lens at the light source of a so-called chip-on-board (COB) LED in which an LED is directly formed on a circuit board. Here, while an independent LED package also includes a COB-type LED, the chip-on-board LED emission light source of the light emitting device of (2) refers to a light source which is made and completed directly on a single circuit board having an area larger than the area of the lens.

A method of making a COB-type light source on a circuit board includes a step of placing a semiconductor light-emitting element (chip) at a predetermined position of the circuit of the circuit board, and electrically connecting the both electrodes of the chip to the circuit via wire connection, etc. The portions of chip, wire connection and their periphery as required are sealed together with a translucent resin, to make an LED light emission source directly on the board. Usually, the seal part becomes convex due to the expansion of sealing liquid. Depending on the case, a cylindrical casing with inner conical shape is bonded to the circuit board so that the chip is housed within the casing, then the interior of the cylinder is sealed to produce a COB light source. Also, an adhesive filled in the escape recess may serve as a sealing liquid of the semiconductor light-emitting element (chip). Next, there is a step of filling with the adhesive the escape recess provided on the light incident side lens surface, which includes a step of pressing the lens to the sealing body located on the semiconductor light-emitting element on the circuit board, followed by a step of curing the adhesive. FIG. 14B is a lens long-axis cross-sectional view of a light emitting device wherein the COB-type LED light emission source is directly made on a circuit board. The bonding process is not particularly limited; a lens may be sequentially bonded to the light source, or a lens may be placed on a predetermined position using an auxiliary plate, etc., an adhesive is filled in the escape recess, then a circuit board may be placed thereon. Conversely, it is also possible to manufacture the light emitting device by putting an auxiliary tool, on which a lens filled with an adhesive is placed at a predetermined position, over a circuit board.

A step of curing the adhesive may be either by UV curing or thermosetting.

(3) A step of preparing a light distribution lens having a fitting mechanism, a step of preparing an LED package, or a circuit board on which a semiconductor light-emitting element (chip) is placed and electrically connected, equipped with a fitting-receiving mechanism that fits the fitting mechanism provided on the lens, and a step of integrating the lens, and the LED package or the circuit board on which semiconductor light-emitting element (chip) is placed and electrically connected, by means of the fitting mechanism without using an adhesive.

That is, (3) is a method for manufacturing a light emitting device, that is integrated by providing a fitting mechanism that mutually fits to the lens side and the LED side or the board side, without using an adhesive; wherein the fitting mechanism of the lens side may be provided by selecting the fitting mechanism for the LED package or the circuit board, depending on the form of light source.

Regarding the light emitting device in which a lens and an LED package are integrated by a fitting mechanism, FIG. 15A shows the light emitting device before and after fitting in a long-axis cross-sectional view. In the fitting mechanism of the lens side, convex pawls are provided at the wall of the lens recess of the light incident side or at a position protruding from the surface of the light incident side, wherein the pawls are facing lateral sides of the base plate or lateral sides of the casing of the LED package. The shape of the pawl may be any shape as long as it has a fitting function, and may be either a wedge shape or round shape. On the other hand, at the lateral side of the base plate or casing of the LED package, a groove, to which the convex pawl of the lens side fits, is provided as the fitting-receiving mechanism. Owing to the mutually-fitted pawl and groove, when the lens is pressed against the LED package, they are fitted and assembled integrally by deflection of the lens and the base of the LED package. When the base plate of the LED package is made of ceramics, they are fitted by elastic deformation of the lens, by which the LED package is gripped.

Fitting mechanism and fitting receiving mechanism provided in the lens and LED package may be exchanged. Also, instead of the sides of the LED package, corners may be utilized. In FIG. 15A, a pawl and a groove to be fitted with the pawl are shown; however, a package insertion stopper 21 and a restraining pawl provided on the lens side may be used to grip the base plate from the upper and lower sides. It is also possible to make the base plate in a trapezoidal shape and create an edge by forming a diagonal surface on the side; or a lens may be fitted to lateral displacement preventing walls 21a, 21b of the lens liquid escape recess by making irregularities on the side wall of the base and letting them stuck on the wall utilizing the elasticity of the lens.

Then, the LED package integrated with the lens is placed in a predetermined circuit of the circuit board, and used as a light emitting device after being fixed by reflow process, etc., or, the LED package is placed in advance on a predetermined circuit of the circuit board and fixed by reflow process, etc., and the lens is fitted thereon, which is used as a light emitting device.

Regarding the light emitting device wherein a lens, and a circuit board on which a semiconductor light-emitting element (chip) is placed and connected, are integrated via a fitting mechanism, FIG. 15B shows the light emitting device before and after fitting in a long-axis cross-sectional view.

The fitting mechanism of the lens side has a leg 31 at a position of the light incident side lens surface near the lens outline of the light incident side, or of the light emitting side lens surface near the lens outline, wherein the leg 31 is to be fitted into a hole 34 drilled in the circuit board 25; and a pawl 32 is provided at the tip of the leg 31, and an alignment part 33 of the lens height relative to the circuit board is provided at the leg base portion. The pawl 32 has a function of not separating once it has been fitted into the circuit board hole, and the alignment part 33 can maintain the gap between the LED package and the escape recess so as to prevent the leg from being inserted excessively into the hole or to prevent displacement of the lens, and therefore the same effect as that of the LED package insertion stopper 21 can be obtained. Preferably, the legs are provided at minimum 2 locations. Also, the leg may be a part of the lens body, or the leg may be formed using a different material and then integrated with the lens body. In addition, the alignment part may be provided in a ring shape on the light incident side of the lens. As can be seen from the diagram showing the lens surface viewed from the light incident side having a fitting mechanism in FIG. 15B, a projection 36 is formed in advance on the light incident side lens surface, so that the ring-shaped alignment part is fixed at a predetermined position, and a hole corresponding to the projection is provided in the ring-shaped alignment part 33, and at the same time, a leg with a pawl 31 is formed by integral molding. By fitting the hole of the alignment part via the fixing projection 36, a ring-shaped fitting mechanism may be provided on the lens light incident side, in addition to bonding using an adhesive as required.

In contrast, in the circuit board wherein a semiconductor light-emitting element (chip) is placed at a predetermined circuit position and connected via wire, and the semiconductor light-emitting element (chip) including the wire connection part are sealed, a hole to which a leg provided on the lens is fitted is provided.

Then, when the lens is pressed against the circuit board, the leg on which a claw is provided is fitted into the hole, so that the lens is fitted to the circuit board with a single touch. Fitting mechanism and fitting receiving mechanism that are mutually fitted may be exchanged.

The leg fitted into the hole may be integrally formed with the lens using the same material. At positions where large mechanical vibration or physical external force is applied, a material having rubber elasticity with restoring force even under large deformation is preferred.

The number of the legs is at least two, and more preferably three or more. A plurality of legs may be placed independently on the lens, and it is also possible to put a ring-shaped cylinder around the outline of the lens, and a fitting part such as pawl may be provided on the cylinder. This method of providing a leg on the lens is also effective when a lens is mounted on a circuit board on which an LED package has been fixed by reflow process. Moreover, it is also effective when the lens that has been fixed in advance to an LED package is fixed to a circuit board by reflow process. In particular, in the case of a lens having a fairly large area, displacement of the lens may be stabilized by legs, so that the method is also effective in fixing by reflow process.

Regarding the method (3) of manufacturing a light emitting device using a fitting mechanism, when several hundreds to thousands of lenses, or tens of thousands of lenses are used, a step of bonding lenses to LEDs using an adhesive is very cumbersome, and it is also necessary to pay attention to handling of the adhesive. In the method of manufacturing a light emitting device of the present invention using a fitting mechanism, by means of the fitting mechanism provided on the circuit board (COB) on which an LED light source is formed and on on the lens side, or the fitting mechanism provided on the LED and the lens side, the lens and the light source can be fixed at a precise position with a one-touch operation. In addition, in the method for fixing the sealing part for sealing a semiconductor light-emitting element and a lens using an adhesive, due to a difference in the surface energy of bonding interface, and due to repetition of rise and fall of heat for a long period of time, the lens may be detached from the LED owing to internal strain and degradation; by using the fitting mechanism, light emitting devices can be used in a stable manner even under environmental changes.

(Lens Material)

Material used in the lens of the present invention is not particularly limited as long as it is transparent and moldable. For example, soft glass, cycloolefin, cycloolefin copolymer, polycarbonate, polystyrene, fluorine, acrylic, epoxy, and silicone are preferred, and a particularly preferably the material is selected from fluorine, acrylic, cycloolefin, cycloolefin copolymer, silicone, epoxy, and a resin or rubber thereof. In particular, a resin or rubber of acrylic, cycloolefin, cycloolefin copolymer, epoxy, and silicone is preferred, and silicone resin or silicone rubber is particularly preferred. Silicone is preferably used because it is heat resistant and cold resistant, does not deteriorate or turn yellow after a long period of use, and its initial properties can be maintained for a long period of time. As the silicone used, liquid silicone is preferred, and an addition-polymerization type is preferably used.

An addition-curable silicone resin composition is not particularly limited, as long as it forms a transparent and cured material of silicone. Specific examples include a composition comprising organopolysiloxane as a base polymer, organohydrogenpolysiloxane, and a heavy metal catalyst such as platinum-based catalyst.

Specific examples of organopolysiloxane include, for example, those represented by the following general formula (1):

$$R_a SiO_{(4-a)/2} \tag{1}$$

(wherein, R may each be the same or different, and is an unsubstituted or substituted monovalent hydrocarbon group with a carbon number of 1 to 10, and "a" is a positive number of 0.8 to 2).

Specific examples of R that is an unsubstituted or substituted monovalent hydrocarbon group include, alkyl groups such as methyl group, ethyl group, propyl group, butyl group; alkenyl groups such as vinyl group, allyl group, butenyl group; aryl groups such as phenyl group, tolyl group; aralkyl groups such as benzyl group; halogen-substituted hydrocarbon groups such as chloromethyl group, chloropropyl group, 3,3,3-trifluoropropyl group in which a part or all of the hydrogen atoms bound to these carbon atoms are substituted with a halogen atom; or cyano group-substituted hydrocarbon groups such as 2-cyanoethyl group substituted with a cyano group; and the like. Of these, those wherein 5-80 mole % of the total R is a phenyl group are particularly preferable in terms of excellent heat resistance and transparency of optical lenses.

Furthermore, those containing alkenyl group such as vinyl group as R, in particular those wherein 1-20 mole % of the total R is alkenyl group are preferred, and those containing two or more alkenyl groups in one molecule are particularly preferably used. Examples of such organopolysiloxane include terminal alkenyl group-containing diorganopolysiloxane, such as dimethyl polysiloxane and dimethylsiloxane-methylphenylsiloxane copolymer having terminal alkenyl group such as vinyl group, and in particular, those which are liquid at room temperature are preferably used.

Specific examples of organohydrogen polysiloxane include, for example, methyl hydrogen polysiloxane, methyl phenyl hydrogen polysiloxane, and the like. Examples of the catalyst include platinum, platinum compounds, organometallic compounds such as dibutyltin diacetate and dibutyltin dilaurate, or metal fatty acid salts such as tin octenoate and the like. Type and amount of these organohydrogen polysiloxane and catalyst are appropriately selected with consideration given to a degree of crosslinking and curing rate.

Examples of the silicone resin composition include "KJR632" and "KE-1935", etc. from Shin-Etsu Chemical Co., Ltd.

Hardness of a silicone resin after curing can be appropriately selected. A light distribution lens made of rubber is resistant to deformation caused by external force and thermal expansion, and is also resistant to impact. On the other hand, since it has a soft surface, dust tends to adhere. A light distribution lens molded with hard resin after curing has a surface resistant to scratch, on which dust hardly adheres. On the other hand, fitting of the lens and LED is not easy because a degree of deformation is small, which is undesirable. Incidentally, the hardness of the light distribution lens of the present invention is, in terms of Shore D hardness measured by the method of JIS K 7215 (durometer hardness test method for plastics), and Shore A hardness measured by the method of JIS K 6253 (durometer hardness test method for rubber), A30-A90 and D10-80, preferably A50-90 and D10-70, and furthermore preferably A60-90 and D10-50.

Lighting equipment used for road lights, street lights or tunnel and for railway platform may be preferably fluorine-coated, when their brightness decreases due to adherence of exhaust gas and train dust, and dust in the premises.

A colored dye or pigment may be dispersed in the uncured silicone composition to provide a filter function to the lens. Also, within the range that does not impair the effects of the present invention, the silicone composition may comprise a phosphor for changing the emission color by converting wavelength of the light emitted from LED element as required, as well as a light diffusion agent for diffusing the light. Furthermore, a phosphor layer, a color filter layer and a light diffusion layer may be provided inside or on the surface of the silicone lens.

In addition, when the silicone lens is a lens in which a buffer layer such as silicone gel or silicone elastomer is provided on the bonded surface, such silicone lens is preferable because it enables to relax the internal stress due to a difference in thermal expansion between the sealing body of the LED device and the silicone lens.

In addition, some of the resin or rubber used as a material of silicone refractive lens may be molded by mixing with fine silica in order to adjust refractive index and linear expansion coefficient.

As the adhesive for bonding a lens to LED, epoxy adhesives and silicone adhesives are preferred because heat resistance is required. When the lens is made of silicone, a silicone adhesive is preferred, and a silicone having a refractive index equivalent to that of the lens after curing is especially preferred. Examples of the adhesive used include, for example, TSE3221 from Momentive Performance Materials Inc.

As the adhesive to be injected into the escape recess of a light distribution lens for bonding and curing, a rubber of silicone or epoxy is preferred. Examples of the silicone adhesive include a gel layer or silicone elastomer layer of polydimethylsiloxane with a hardness in terms of penetration of 90-37 measured by a penetrometer in accordance with JIS K2220, and an elastomer layer of polydimethylsiloxane with a Shore hardness of 5-60 measured by a Shore A hardness meter in accordance with JIS Z2246. Transparent adhesive agent may be a reduced low-molecular-weight-siloxane product, for example, commercially available products such as LPS-1400, LPS-2400 (both from Shin-Etsu Chemical Co., Ltd.; trade names), OE-6250, Sotefa, SE1740 (all from Dow Corning Toray Silicone Company Ltd.; product name). Due to the physical adhesion of a gel material such as this silicone gel layer and the physical elasticity of silicone elastomer layer, the lens is closely adhered to the LED without any gap.

When the transparent adhesive layer 23 is a silicone gel layer or silicone elastomer layer, it helps to alleviate the stress due to a difference in the linear expansion coefficient between the lens and LED.

Although the size of a lens of the present invention can be selected as desired, it is necessary for the lens to have a size sufficient to cover at least the entire LED emission source, and desirably, as a light emitting device, the lens size in the lens short-axis direction is more than 1.2 times larger than the size of the LED package when viewed from the central optical axis side.

The LED package used as a light source in the illumination device of the present invention can be appropriately selected and used. In such case, the shape of the escape recess of the lens on the light incident side can be changed to match the shape of the LED package. Examples of a preferred LED package to be used include the one wherein the upper part of the semiconductor light-emitting element (chip) is hemispherically sealed with a transparent resin. For example, NVSW219B series and NCSW219B series from Nichia Corporation is preferably used. In addition, COB type (for example, NCSWL036A series from Nichia Corporation) and top-emitting type (for example, NS6W183B from Nichia Corporation) wherein a semiconductor light-emitting element (chip) is housed in a casing with a mortar-shaped inside may also be used, by making an escape recess on the surface of the lens light incident side which is to be compatible with the package, or by selecting the refractive index of the adhesive after curing to be equivalent to the refractive index of the lens. In addition, LED light sources may be a blue monochromatic LED, a red monochromatic LED, an ultraviolet light emitting LED, or an infrared ray emitting LED. It may also be a power LED.

Emission color is preferably a white color for lighting; however, since adjustment of hue such as warm color/cold color and toning in accordance with the color of a sign board, etc. is necessary, a color filter layer and a wavelength conversion layer may be provided atop the LED light source. A silicone cap containing a phosphor or pigment dye with a size that matches the surface of the upper region of the LED sealing part or the surface of the escape recess may be interposed. They may also be contained in the lens. In addition, a color pigment or a phosphor may be mixed to achieve desired color tone.

In the present invention, preferably-used phosphor is a pigment, and a silicate, aluminate, sialon, and Cousin phosphors can be used as appropriate.

When toning the illumination light to match the target portion to be illuminated, since the light distribution lens of the present invention provides an elliptical or rectangular light distribution, color separation occurs and color rendering properties tend to decrease if an LED, in which RGB semiconductor light emitting devices (chips) are contained in a single package to emit a mixture of lights, is used. When an LED, on which a phosphor is placed on a blue light-emitting semiconductor chip such that the phosphor covers the chip, is used, color separation is less prone to occur. Color separation is less prone to occur when an LED having a single element is used, compared to the case of LED having a plurality of semiconductor light emitting elements.

The circuit board used in the present invention is not necessary a special type, as long as it can provide a light emitting device having heat resistance, cold resistance and light resistance, and it has a sufficient strength to be installed in the case of lighting device. Preferably, a material having thermal conductivity for dissipating the heat generated by the LED package to outside is preferred. For example, preferable circuit boards are those wherein an insulating layer is provided on a metal plate such as copper, aluminum or graphite, on which a circuit is provided, and circuit boards using ceramic, because thermal conductivity is improved. When the circuit board is not the one with a white-colored base such as conventional glass epoxy circuit board, its reflection efficiency can be increased by applying a white reflective agent on the surface of peripheral part of the circuit board except for the contact portion of electrodes of the light-emitting device.

As the white reflective agent, it is possible to use a coating solution wherein white pigment such as titanium oxide, calcium carbonate, talc, barium sulfate, and zinc oxide is filled into uncured silicone resin or silicone rubber. For example, there is SWR-PK series ink from Asahi Rubber Co., Ltd.

Legs used for the light distribution lens of the present invention may be those which are manufactured integrally with the same material as the lens, or they may be manufactured using a rubber that is softer than the light distribution lens. Metals may also be used.

When a metal is used for the leg, a leg integrated with a ring is prepared, and the leg is fixed to the lens by caulking the ring to the lens rim. It is also possible to assemble them by preparing dedicated fitting parts.

When a light source for street light and backlight is manufactured using a light distribution lens of the present invention, a light diffusion plate may be provided on the light emitting side of the lens. Moreover, in the case of street light, corridor ceiling, warehouse ceiling, and tunnel illumination in which illuminated surface should be illuminated with a light from the high position in the longitudinal direction, a plurality of light emitting devices may be arranged in the same direction. In addition, in the case of tunnel lighting and when the tunnel is illuminated from the wall surface, by making the lens shape in the short-axis direction to be asymmetric with respect to the long axis, a road position distant from the light source can be illuminated with the light that illuminates the road obliquely downward from the above with the light distribution part having large illuminance, and therefore, a homogeneous illumination on the road surface along the road can be achieved. Also, when it is desired to scatter the light in a desired direction other than the lens long-axis direction, some of the plurality of lenses may be arranged while changing their direction of long axis relative to the direction of other lenses.

Moreover, for a road with a certain width, when the direction of the road and the direction of the lens long axis are the same, the light emitted obliquely from the front enters the eyes at a shallow angle, which may cause dazzling; in such a case, the lens long-axis direction is aligned with the road width direction, so that the light distribution in the long axis direction is matched with the road width, and by illuminating the traveling direction of the road using the illumination width of the lens short axis, the illumination light enters the eyes only at a large elevation angle, thereby avoiding dazzling due to the illumination light.

It is also possible to produce a light emitting device by combining light distribution lenses with different illuminance patterns on a single circuit board, or produce a light emitting device by mounting and combining different lenses.

When a light reflection layer is provided inside the housing that houses a circuit board and a reflector of the light emitting device, the light can be effectively emitted to the front side. Preferably, a light reflection layer coated with a white paint is more inexpensive than specular reflection.

In the light emitting device of the present invention, toning of the illumination light as a whole may be performed by placing a plurality of LED light sources with different wavelengths on a circuit board, or a mixture of separate light from different light emitting devices with different wavelengths may be used.

EXAMPLES (Example of Production)
(Production of Lens)

The shape of a three-dimensional structure of the light emitting surface of the light distribution lens was carved on a lower mold. On an upper mold, a three-dimensional shape of the light incident side was carved, which enables the formation of an escape recess to accommodate the hemispherical sealing part of an LED package (NCSW119) from Nichia Corporation, and a liquid escape recess to hold excess adhesive, in the light distribution lens after molding. In a single mold, 10 of these shapes were arranged in the long-axis direction and 20 shapes were arranged in the short-axis direction, so that a total of 200 lenses can be obtained at once from a pair of the upper and lower molds.

Then, a liquid silicone (SR-7090 from Momentive Performance Materials Inc.) that enables a lens having a Shore A hardness of A90 after curing was injected in a concavity of the lower mold via potting, the upper mold was closed and heated with a molding condition of 180° C. for 10 min, to carry out compression molding.

Next, the lens was removed from the mold, the base part and others were finished, and an inspection was carried out.

The light distribution lens molded in the mold and having a shape shown in FIGS. 3A, 3B, 3C(1), 3C(2), 3C(3), and 3C(4) after the inspection was verified that it was produced as designed.
(1) Length of the lens long axis: 7.7 mm, length of the lens short axis: 5.4 mm;
(2) Continuous surface including straight line parts parallel to the short axis, which are provided in the three-dimensional shape as viewed from the light emitting side:
  Straight lines parallel to the lens short axis:maximum 18.2% relative to the length of the short axis; and,
  Length of the continuous surface in the long-axis direction: 40.5% relative to the length of the long axis;
(3) Shape of the lens of the light incident side:
  Recess of hemispherical shape with 3.3-mm diameter;
  Walls of the liquid escape recess at which 3.6×3.6 mm base of the LED is in contact;
  Depth of the liquid escape recess: 0.45 mm; and,
  Depth of the insertion stopper: 0.3 mm.
[Bonding of Lens and LED]

Next, an appropriate amount of an adhesive (TSE-3221 from Momentive Performance Materials Inc.) was injected into the escape recess of the light incident surface, an LED package (NCSW119) was taken and its sealing part was pushed into the adhesive-filled part of the lens until the LED package cannot further be inserted, thereby they were joined. In this case, they are joined such that a part of the base of the LED package enters within the lens. In addition, excess adhesive spreads into the liquid escape recess, thereby preventing its outflow into terminal portions.

Then, a heat treatment of 120° C. for 30 min by oven was carried out to cure the adhesive.
(1) Thickness of the base plate of the LED package outside the light incident surface: 0.3 mm; and,
(2) Thickness of the adhesive filled in the gap between the liquid escape recess and hemispherical sealing part: 0.2 mm (equivalent to 14% of the sealing-part diameter).
[Production of Light Emitting Device]

Following the inspection after bonding, a plurality of LED packages with lens are placed on the predetermined circuit position wherein a solder is piled on the circuit board, and reflow soldering is carried out to complete the light emitting device. In the circuit board in this case, an insulating layer is provided on an aluminum plate, and a circuit is provided thereon, and the entire circuit board except where the LED package is mounted is applied with a 30-μm thick white ink (SWR-PK-01) from Asahi Rubber Inc., which forms a light reflecting layer after curing.

INDUSTRIAL APPLICABILITY

The light distribution lens of the present invention and an LED light emitting illumination device equipped with the light distribution lens enable to illuminate a surface to be illuminated with homogeneous light with a light distribution having long and short axes; therefore, they can be conveniently used as lighting equipment for illuminated surfaces having anisotropy, such as rectangular or elliptical surfaces, for example, street lights along a road, a lamp stand for illuminating desks, backlight of display panels, light for corridor ceiling, tunnels, railway station platforms, and automobile lamps. In addition, they can be effectively used as a light source for backlight of signs with anisotropic shapes and of liquid crystal display panels.

DESCRIPTION OF SYMBOLS

1. Straight-line part:
1a. Straight-line part on the lens short-axis cross section;
1b. Straight-line part parallel to the lens short-axis cross section;
1c. Straight-line part on the lens long-axis cross section; and,
1d. Curve of the cross section of groove-shaped recess;
2. Curve showing the shape of lens short-axis cross section of the light emitting side;
3. Curve showing the shape of lens long-axis cross section of the light emitting side;
4. Lens central optical axis;
5. Short axis;
6. Long axis;
7. Curve showing the cross section of continuous surface along the shape of the lens long-axis cross section of the light emitting side;
8. Continuous surface having straight lines on the lens short-axis cross section and on cross sections parallel to said cross section, which appears in the three-dimensional shape of the light emitting side;
8a. First continuous surface;
8b. Second continuous surface; and,
8c. Outline part of the light emitting side of the lens long-axis cross section in the second continuous surface;
9. Notch;
10. Light source center;
11. Locus of a point on the lens surface at which the line connecting the light source center and this point is perpendicular to the convex-part lens surface;
12. Arc locus that becomes the edge of a notch;
13. Virtual cone having a light source center and a conical surface that is perpendicular to the convex-part lens surface;
14. Planar part having straight-line parts in the long-axis direction and short-axis direction;
15. Tangent line of rising convex part of the light incident surface;
16. Line connecting the light source center and a point on the lens surface at which tangent line of that point is perpendicular to the light incident surface;
17. Locus of the points on the lens surface at which tangent line of these points is perpendicular to the light incident surface;
18. Circular arc-like curve of the lens short-axis cross section;
19. Escape recess;
20. Liquid escape recess;
21. Insertion stopper of LED package:
21a, 21b. Lateral-displacement preventing walls of LED package; and,
22. LED package;
23. Adhesive;
24. Light emitting device;
25. Circuit board;
26. Chip-on-board (COB) light emission source;
27. Gap C between circuit board and lens surface of the light incident side;
30. Light emitting device assembled with fitting mechanism;
31. Leg;
32. Pawl;
33. Alignment part;
34. Hole;
35. Fitting-receiving groove;
36. Alignment fixing projection; and,
37. Ridge seal body.

We claim:

1. A light distribution lens to be placed on a light emitting element, having a light incident side facing the light emitting element and a light emitting side opposite to the light incident side, wherein a planar shape formed by the outline of the lens viewed from the light emitting side has a long axis on the light incident side of the lens and a short axis perpendicular to the long axis on the same plane, and wherein the lens central optical axis passing through the light source center of the light emitting element from the light incident side to the light emitting side is perpendicular to each of said long axis and short axis at their intersection, and the lens surface of the light emitting side has the following three-dimensional surface shape:

in the lens long-axis cross section which is a lens's cross section taken along the plane including the long axis and the lens central optical axis, said shape is concave at and near the lens central optical axis, and is convex at both of its lateral sides, and in the lens short-axis cross section which is a lens's cross section taken along the plane including the short axis and the lens central optical axis, said shape has a straight-line part at and near the lens central optical axis and the length of the straight-line part is 5% or more relative to the length of the short axis, and is convex at both of its lateral sides.

2. The light distribution lens according to claim 1, in which the lens surface of the light emitting side has a three-dimensional surface shape, wherein, in a lens cross section taken along a plane parallel to the lens short-axis cross section and passing continuous positions along the curve of the light emitting side of the lens long-axis cross section, the surface shape has a straight-line part that is parallel to the lens-short axis cross section and that intersects with the lens long-axis cross section, and has convex parts at both of its lateral sides wherein a continuous curved surface, that intersects with the central optical axis, is formed from a set of such straight-line parts along the curve of the light emitting side of the lens long-axis cross section.

3. The light distribution lens according to claim 2, wherein the straight-line part that is parallel to the lens short-axis cross section is parallel to the lens short axis.

4. The light distribution lens according to claim 2, wherein the shape of the lens surface of the light emitting side in a lens cross section taken along a plane parallel to the lens short-axis cross section and at the position included in said continuous curved surface has a straight-line part that is parallel to the lens short axis and that intersects with the lens long-axis cross section, wherein the length of said continuous curved surface in the long-axis direction viewed from the light emitting side is 8% or more of the length of the long axis.

5. The light distribution lens according to claim 4, wherein, as the continuous curved surface formed along the curve of the light emitting side of the lens long-axis cross section, in addition to the first continuous curved surface through which the lens central optical axis passes, there is (a) second continuous curved surface(s) in which the lens central optical axis position is not included, and which is(are) formed at the convex part of the lens long-axis cross section distant from the first continuous curved surface.

6. The light distribution lens according to claim 5, wherein,
in the convex part of the light emitting side of the lens long-axis cross section, the lens has a notch at points on the convex curve at which a line connecting the light source center and the points on the convex curve coincides with the normal lines of the convex curve at the points, and
said notch is provided along the normal lines from the convex curve such that either a convex curve portion outside of the normal lines becomes concave, or a convex curve portion outside of the normal lines becomes convex, thereby providing a second continuous curved surface at the convex part that is in contact with the notch and outside of the normal lines.

7. The light distribution lens according to claim 6, wherein the three-dimensional shape of the lens surface of the light emitting side excluding the notch is a smooth continuous curved surface.

8. The light distribution lens according to claim 1, wherein in the lens long-axis cross section, the shape of the light emitting side has a straight-line part with a length of less than 5% of the length of the long axis at and near the lens central optical axis position, and the shape is concave at both of its lateral sides and is convex at further lateral sides, and the straight-line part of the long-axis cross section and the short-axis cross section further has a concave portion.

9. The light distribution lens according to claim 1, wherein the three-dimensional shape of the lens surface of the light emitting side is a smooth continuous curved surface.

10. The light distribution lens according to any one of claim 1, wherein the convex shape is composed of curves with different curvatures.

11. The light distribution lens according to claim 1, wherein the convex shape at positions lateral to the straight-line part in the shape of the light emitting side of the long-axis cross section has a circular arc composed of a simple circle.

12. The light distribution lens according to claim 1, wherein the lens has a surface including a straight line almost parallel to the lens central optical axis throughout or a part of the periphery of the lens, and said surface constitutes the whole or a part of the outline of the lens.

13. The light distribution lens according to claim 1, wherein
the three-dimensional shape of the lens surface of the light emitting side has a convex shape rising upward and expanding outward from the outline shape of the lens base plane of the light incident side, and,
the outline shape of the lens viewed from the light emitting side is larger than the outline shape of the lens base plane of the light incident side.

14. The light distribution lens according to claim 1, wherein the three-dimensional shape of the lens surface of the light emitting side has two mirror symmetry planes perpendicular to each other, and wherein the lens central optical axis is the line of intersection of these mirror symmetry planes.

15. The light distribution lens according to claim 1, wherein the lens has, at its light incident side, an escape recess to house the whole or a part of a light emitting element, a sealing member for the light emitting element, and a base on which these are placed.

16. The light distribution lens according to claim 15, wherein the lens further has, at its light incident side, at least one of the group consisting of a package insertion stopper, a lateral displacement preventing wall, and a fitting mechanism.

17. The light distribution lens according to claim 15, wherein the escape recess is a dome-shaped escape recess.

18. The light distribution lens according to claim 1, wherein the lens has, at its light incident side, a liquid escape recess for an adhesive or filler.

19. A method of manufacturing a light distribution lens, characterized in that the lens according to claim 1 is formed by injecting any of cycloolefin, cycloolefin copolymer, acrylic, silicone, epoxy, and a resin or rubber thereof into a mold and curing it.

20. A method of manufacturing a light emitting device that comprises a base or a circuit board on which the light distribution lens according to claim 1 and a light emitting element are placed, wherein the method comprises any of the following steps (1) to (3):
(1) a step of preparing an LED package in which a semiconductor light-emitting element (chip) electrically connected to the terminals of electrodes is sealed with a transparent material,
a step of preparing the light distribution lens having an escape recess and a liquid escape recess on the lens surface of the light incident side,
a step of filling the escape recess with an adhesive,
a step of bonding the adhesive-filled part to the sealing part of the LED package by pressing them each other such that the emission center matches the central optical axis of the lens,
a step of curing the adhesive, and
a step of placing and fixing the LED package on a circuit board;
(2) a step of placing a semiconductor light-emitting element (chip) on the circuit of a circuit board, electrically connecting the light-emitting element (chip) to the circuit to produce the circuit board having a chip-on-board LED light-emitting source,
a step of preparing the light distribution lens having an escape recess and a liquid escape recess on the lens surface of the light incident side,
a step of filling the escape recess with an adhesive,
a step of bonding the adhesive-filled part to the LED light-emitting source by pressing them each other such that the emission center of the semiconductor light-emitting element matches the central optical axis of the light distribution lens, and
a step of curing the adhesive;
(3) a step of preparing the light distribution lens having an escape recess and a fitting mechanism on the lens surface of the light incident side,
a step of preparing a circuit board having a chip-on-board LED light-emitting source, in which an LED package or a semiconductor light-emitting element (chip) equipped with a fitting-receiving mechanism that fits with the fitting mechanism provided on the light distribution lens, is placed on the circuit board, and
a step of integrating the light distribution lens with the LED package or the circuit board via the fitting mechanism, without using an adhesive.

21. A light emitting device, comprising the light distribution lens according to claim 1; and, a base or a circuit board on which a light emitting element and said light distribution lens are placed.

22. The light emitting device according to claim 21, wherein a gap is provided between the lens surface of the light incident side and a circuit board on which the base, on which the light emitting element is placed.

* * * * *